United States Patent
Lubomirsky et al.

(10) Patent No.: US 9,450,172 B2
(45) Date of Patent: Sep. 20, 2016

(54) ELECTROMECHANICAL EFFECT IN METAL OXIDES

(75) Inventors: Igor Lubomirsky, Petach-Tikva (IL); Roman Korobko, Rehovot (IL); Anna Kossoy, Rehovot (IL); Harry L. Tuller, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 190 days.

(21) Appl. No.: 13/877,662

(22) PCT Filed: Oct. 5, 2011

(86) PCT No.: PCT/IL2011/000780
§ 371 (c)(1),
(2), (4) Date: Apr. 4, 2013

(87) PCT Pub. No.: WO2012/046234
PCT Pub. Date: Apr. 12, 2012

(65) Prior Publication Data
US 2013/0207513 A1    Aug. 15, 2013

Related U.S. Application Data

(60) Provisional application No. 61/390,163, filed on Oct. 5, 2010, provisional application No. 61/393,498, filed on Oct. 15, 2010.

(51) Int. Cl.
*H01L 41/187* (2006.01)
*H01L 41/27* (2013.01)
(Continued)

(52) U.S. Cl.
CPC .......... *H01L 41/187* (2013.01); *H01L 41/094* (2013.01); *H01L 41/27* (2013.01); *H01L 41/316* (2013.01); *Y10T 29/42* (2015.01)

(58) Field of Classification Search
CPC ..................................................... H01L 41/187
USPC ....................... 310/358; 252/62.9 R, 62.9 PZ
See application file for complete search history.

(56) References Cited

U.S. PATENT DOCUMENTS

2006/0229187 A1* 10/2006 Liufu ............................ 310/358
2009/0102324 A1* 4/2009 Sone et al. .................... 310/358

(Continued)

OTHER PUBLICATIONS

Atavin et al.; "Determination of the errors of resonance frequency and quality factor measurements from the resonance curves of vibration amplitudes", Measurement Techniques, 2003. 46(3): p. 249-253.

(Continued)

*Primary Examiner* — Derek Rosenau
(74) *Attorney, Agent, or Firm* — Mark S. Cohen; Pearl Cohen Zedek Latzer Baratz LLP

(57) ABSTRACT

This invention provides an electromechanical device comprising an active material comprising a metal oxide such as Ce0.8Gd0.2O1.9 wherein the elastic modulus of metal oxide can be modulated by applying external electric field. The Ce0.8Gd0.2O1.9 layer in a substrate\electrode\Ce0.8Gd0.2O1.9\electrode structure or conductive substrate\Ce0.8Gd0.2O1.9\electrode structure develops a stress upon applying an electric field. This invention provides methods for tailoring the elastic modulus of materials using an electric field for the generation of an electromechanical response.

19 Claims, 11 Drawing Sheets

(51) Int. Cl.
*H01L 41/09* (2006.01)
*H01L 41/316* (2013.01)

(56) References Cited

U.S. PATENT DOCUMENTS

2010/0079555 A1* 4/2010 Arakawa ............... 310/358
2010/0103226 A1* 4/2010 Sakashita et al. ...... 310/358

OTHER PUBLICATIONS

Atkinson et al. "Chemically-induced stresses in ceramic oxygen ion-conducting membranes", Solid State Ionics, 129(1-4), 2000.
Atkinson; "Chemically-induced stresses in gadolinium-doped ceria solid oxide fuel cell electrolytes", Solid State Ionics, 95(3-4), 249, 1997.
Choi et al. "Fabrication of gd2o3-doped ce02 thin films for single chamber type solid oxide fuel cells and their characterization" Journal of the electrochemical society vol. 156, No. 3 pp. 381-385, Mar. 2009.
Gauckler et al.; "Solid oxide fuel cells: Systems and materials", Chimia, 58(12), 837, 2004.
Greenberg et al.; "Elasticity of solids with a large concentration of point defects. Advanced Functional Materials", 2006. 16(1): p. 48-52.
Hill et al.; "Debye and non-Debye relaxation", Journal of Physics C: Solid State Physics, 1985, 18(19): p. 3829.
Inaba et al.; "Ceria-based solid electrolytes", Solid State Ionics, 83(1-2), 1996.
International Search Report for PCT Application No. PCT/IL2011/000780 mailed Apr. 12, 2012.
Kim et al.; "On the conductivity mechanism of nanocrystalline ceria", Journal of the Electrochemical Society, 2002, 149(10): p. J73-J83.
Kossoy et al.; "Elasticity of solids with a large concentration of point defects II. The chemical strain effect in Ce0.8Gd0.2O1.9", Advanced Functional Materials, 2007, 17(14): p. 2393-2398.
Kossoy et al.; "Influence of Point-Defect Reaction Kinetics on the Lattice Parameter of Ce0.8Gd0.2O1.9", Advanced Functional Materials, 2009, 19(4): p. 634-641.
Kossoy et al.; "Local Structure and Strain-Induced Distortion in Ce0.8Gd0.2O1.9", Advanced Materials, 2010: p. NA.
Kossoy et al.; "On the origin of the lattice constant anomaly in nanocrystalline ceria", Physical Chemistry Chemical Physics, 2006. 8(9): p. 1111-1115.
Kossoy et al.; "Room temperature phase transition in CeO2 nanocrystalline films", Journal of Electroceramics, 2004. 13(1-3): p. 605-608.
Kossoy; "Chemical strain effect—toward stress-adaptive nanocrystalline materials", Materials and Interfaces 2010.
Lay et al.; "Dielectric and Anelastic Relaxation in Ca-Doped Cerium Dioxide", Physica Status Solidi B-Basic Research, 1971, 43(1): p. 175-&.
Liu. "Dielectric and electrical properties of gadolinia doped ceria" Journal of Alloys and Compounds, vol. 479, issue 1-2, p. 769-771. Jun. 24, 2009.
Lubomirsky; "Stress adaptation in ceramic thin films", Physical Chemistry Chemical Physics, 2007, 9(28): p. 3701-3710.
Mogensen et al.; "Physical, chemical and electrochemical properties of pure and doped ceria", Solid State Ionics, 129(1-4), 2000.
MTC, Piezoelectric Brochure. 2007, Morgan Technical Ceramics ElectroCeramics.
Nakayama et al.; "First-principles study on defect chemistry and migration of oxide ions in ceria doped with rare-earth cations", Physical Chemistry Chemical Physics, 11, 3241, 2009.
Newnham et al.; "Electrostriction: Nonlinear electromechanical coupling in solid dielectrics", Journal of Physical Chemistry B, 1997, 101(48): p. 10141-10150.
Stoney; "The tension of metallic films deposited by electrolysis",. Proceedings of the Royal Society of London. Series A, Containing Papers of a Mathematical and Physical Character, 1909: p. 172.
Sundar et al. "Interferometric evaluation of electrostriction coefficients" Materials Research Bulletin, vol. 31, No. 5, pp. 555-563, May 1996.
Sundar et al.; "Converse method measurements of electrostriction coefficients in low-K dielectrics", Materials Research Bulletin, 1996, 31(5): p. 545-554.
Swaroop et al.; Fast ion transport in nanoscaled thin film cerium oxide. Solid State Ionics, 2008. 179(21-26): p. 1205-1208.
TRS, Electrostrictors Brochure, TRS Technologies.
Tuller; "Ionic conduction in nanocrystalline materials", Solid State Ionics, 131, 143-157, 2000.

\* cited by examiner

ELECTROMECHANICAL EFFECT IN METAL OXIDES

CROSS-REFERENCE TO RELATED APPLICATIONS

This application is a National Phase Application of PCT International Application No. PCT/IL2011/000780, International Filing Date Oct. 5, 2011, claiming priority of U.S. Patent Application No. 61/390,163 filed Oct. 5, 2010, and U.S. Patent Application No. 61/393,498, filed Oct. 15, 2010, all of which are hereby incorporated by reference in their entirety.

FIELD OF THE INVENTION

This invention provides an electromechanical device comprising an active material comprising a metal oxide such as $Ce_{0.8}Gd_{0.2}O_{1.9}$ wherein the elastic modulus of metal oxide can be modulated by applying external electric field. The $Ce_{0.8}Gd_{0.2}O_{1.9}$ layer in a substrate\electrode\$Ce_{0.8}Gd_{0.2}O_{1.9}$\electrode structure or conductive substrate\$Ce_{0.8}Gd_{0.2}O_{1.9}$\electrode structure develops a stress upon applying an electric field. This invention provides methods for tailoring the elastic modulus of materials using an electric field for the generation of an electromechanical response.

BACKGROUND OF THE INVENTION

Electromechanically active materials, i.e., materials developing mechanical stress in response to the application of an external electric field are of a great importance for a wide range of applications ranging from electromechanical transducers to micro-pumps. There are two major classes of materials currently in use: piezoelectric and electrostrictive. Classical piezoelectric and electrostrictive materials have electromechanical response well below 1 nm/V, typically 0.2-0.3 nm/V. This implies that generation of a 1 μm displacement requires application of a few thousand volts of external bias. No noticeable improvement in performance has been achieved during the last three decades. Although both piezoelectric and electrostrictive materials may develop stress of hundreds of MPa, small displacements restrict their field of applications. There are materials that may generate large displacements under application of electric fields (10-100 nm/V), i.e. the so-called porous electrets. However, the stress in these materials does not exceed a few MPa, making them unusable for most of applications requiring generation of a force above a few mN. From this standpoint, a material that can generate large displacements and large force may be of a considerable practical importance.

Microscopic origin of inelastic effects in $Ce_{0.8}Gd_{0.2}O_{1.9}$

Thin films of $Ce_{0.8}Gd_{0.2}O_{1.9}$, one of the most important ionic conductors, exhibit a number of elastic anomalies, i.e. both spontaneous changes in lattice parameter as well as inelastic effects. The most striking of these is the ability to exhibit two different elastic moduli depending on time scale. This phenomenon, which has been called the chemical strain effect, can cause an absolute change in volume of ~0.2% even if the external stress is homogenous. As such, the internal reorganization of point defects has been cited as a probable cause of the inelastic behavior (chemical strain) rather than the more commonly observed stress gradient-induced diffusion. Recently, the local bonding in $Ce_{0.8}Gd_{0.2}O_{1.9}$ and in $CeO_{2-x}$ (x=0-0.05) was studied by extended X-ray absorption fine structure (EXAFS) spectroscopy. This work revealed that in $Ce_{0.8}Gd_{0.2}O_{1.9}$, the cation-O bond is shorter than would be expected on the basis of the X-ray diffraction measurements of the average fluorite structure. Analyses of the $1^{st}$ and $2^{nd}$ coordination shells of Ce and Gd provided evidence that (1) the average distance from a Ce ion to an oxygen vacancy is larger than the mean Ce—O bond length and that (2) supported the theoretical finding that oxygen vacancies induced by Gd-doping prefer coordination with Ce ions rather than with Gd ions. Furthermore, it was found that in the presence of compressive strain of 0.3±0.1%, the average Ce—O bond length is decreased by 1±0.5%. The rearrangement of the Ce—O bond under strain was cited as a probable cause of the elastic anomalies in $Ce_{0.8}Gd_{0.2}O_{1.9}$. The scenario for the chemical strain effect that was deduced from these studies is as follows. At room temperature, the cations and the anions shift with respect to each other so that Ce ions are observed to move away from the oxygen vacancies, locally distorting the symmetry. The fact that self-supported films of $Ce_{0.8}Gd_{0.2}O_{1.9}$ spontaneously buckle at room temperature suggests that this shift of the Ce ions results in an initial volume increase. Heating decreases the repulsion between the $Ce^{4+}$ ions and the oxygen vacancies, thereby restoring the more symmetrical environment and leading to film flattening. The activation energy deduced from the film flattening time is comparable to that measured for the self-supported $Ce_{0.8}Gd_{0.2}O_{1.9}$ films. This suggests that the microscopic processes jointly responsible for local distortions and elastic anomalies are similar for both oxygen deficient and Gd-doped ceria.

Elastic dipoles in $Ce_{0.8}Gd_{0.2}O_{1.9}$

The analysis discussed herein above indicates that the cerium-oxygen vacancy, $Ce_{Ce}$—$V_O$, interaction forms an elastic dipole, which can easily reorient under external stress similar to Gorky or Snoek effects. However, the Gorsky and Snoek effects are usually observed in electrically conductive materials (metals or alloys). The uniqueness of the $Ce_{Ce}$—$V_O$ elastic dipole is that at room temperature, $Ce_{0.8}Gd_{0.2}O_{1.9}$ is a poorly conductive material. Therefore, $Ce_{Ce}$—$V_O$ dipoles may reorient under an external electric field. The reorientation takes place by moving of the oxygen vacancy to the neighboring oxygen site. Since, $Ce_{0.8}Gd_{0.2}O_{1.9}$ is a good ionic conductor, even at room temperature, the oxygen diffusion coefficient is $\approx 10^{-17}$ $cm^2$/sec, which implies that the characteristic time necessary for the vacancy to shift to a neighboring site is about a minute. Therefore, application of the external electric field to $Ce_{0.8}Gd_{0.2}O_{1.9}$ may result in a rearrangement of the elastic dipoles in the course of a few minutes. The effect is expected to be two fold: a) an applied electric field may result in strain and stress directly and b) application of the external field may affect the "effective" elastic modulus of $Ce_{0.8}Gd_{0.2}O_{1.9}$ by suppressing the chemical strain effect. Therefore, if the material is under externally imposed strain (stress), then suppression of the chemical strain effect by an external electric field should manifest itself as an "increase" of the effective elastic modulus.

SUMMARY OF THE INVENTION

In one embodiment, this invention provides an electromechanical device comprising an active material wherein upon application of an electric field said active material generates displacement, stress or a combination thereof.

In one embodiment, this invention provides an electromechanical device comprising a ceria-based material wherein upon application of an electric field said ceria-based material generates displacement, stress or a combination thereof.

In one embodiment, the in-plane strain of said active material ranges between 0.1%-0.4%. In another embodiment, the active material is strain free. In one embodiment, the active material is a metal oxide. In another embodiment, the active material is ceria-based material. In one embodiment, the metal oxide is doped by a metal ion. In one embodiment, the metal ion is Gd. In one embodiment, the active material is $Ce_xGd_yO_z$. In one embodiment, the $Ce_xGd_yO_z$ is $Ce_{0.8}Gd_{0.2}O_{1.9}$. In one embodiment, x ranges between 0.95-0.63, y ranges between 0.05-0.37 and z ranges between 2-(y/2). In one embodiment, displacement is at least 100 pm/V. In one embodiment, the stress developed in said active material is at least 100 MPa. In one embodiment, the active material comprising $ZrO_2$, $CeO_2$, $Bi_2O_3$, oxides of Sr, La, Fe, Co, or combinations thereof. In one embodiment, the active material further comprises any metal ion as a dopant. In one embodiment, the metal ion comprising a Lanthanide ion.

In one embodiment, the device further comprises conductive contacts. In one embodiment, the conductive contacts comprising metal. In one embodiment, the metal comprising Cr, Al, Ag, Ti or combination thereof. In one embodiment, the thickness of said conductive contacts ranges between 50 nm and 150 nm. In one embodiment, device is supported by a substrate.

In one embodiment, the substrate comprising glass. In one embodiment, the thickness of said glass ranges between 50 micrometers and 500 micrometers. In one embodiment, the active material is formed by radio frequency magnetron sputtering.

In one embodiment, the thickness of the active material ranges between 0.35 and 1.0 micrometers.

In one embodiment, this invention provides a sensor comprising a device, wherein the device is an electromechanical device comprising an active material, wherein upon application of an electric field the active material generates displacement, stress or a combination thereof.

In one embodiment, this invention provides an actuator comprising a device, wherein the device is an electromechanical device comprising an active material, wherein upon application of an electric field the active material generates displacement, stress or a combination thereof.

In one embodiment, this invention provides a process for making an electromechanical device, said process comprising:
  forming a first conductive layer;
  forming a layer of an active material in contact with said first conductive layer and;
  forming a second conductive layer in contact with said active material layer;
  wherein upon application of an electric field said active material generates displacement, stress or a combination thereof.

In one embodiment, this invention provides a process for making an electromechanical device, said process comprising:
  forming a first conductive layer;
  forming a layer of a ceria-based material in contact with said first conductive layer and;
  forming a second conductive layer in contact with said active material layer;
  wherein upon application of an electric field said active material generates displacement, stress or a combination thereof.

In one embodiment, the first conductive layer is formed on a substrate. In another embodiment the substrate is conductive. In another embodiment, if the substrate is conductive there is no need for a first conductive layer and the active material is formed directly on the conductive substrate. In one embodiment, the conductive layer is formed by electron beam deposition. In one embodiment, the layer of the active material is formed by radio frequency magnetron sputtering. In one embodiment, the first and the second conductive layers are connected to a power supply.

In one embodiment, the thickness of the conductive layer ranges between 50 nm and 150 nm. In one embodiment, the device is supported by a substrate. In one embodiment, the thickness of the substrate ranges between 50 micrometers and 500 micrometers. In one embodiment, the substrate comprising glass. In one embodiment, the active material is formed by radio frequency magnetron sputtering. In one embodiment, the thickness of the active material ranges between 0.35 and 1.0 micrometers.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Measuring the curvature without applied voltage and under voltage applied allows determination of stress.

Translation of the substrate by a distance $\Delta d$ causes displacement of the laser beam on the CCD camera by a distance $\Delta D$. The curvature of the samples is determined as $$\kappa = \frac{1}{ROC} \approx \frac{1}{L} \cdot \frac{\Delta D}{\Delta d}$$

wherein ROC is the radius of curvature. In one embodiment, the location of the reflected laser beam spot on camera [pixels] is measured as a function of translation stage step (steps).

Change in the curvature is proportional to the change in the in-plane stress in the thin film and is given by the Stoney formula:

$$\Delta \sigma_{xx} \cong -Y_B^s \frac{t_s^2 \cdot \Delta k}{6t_f},$$

wherein $Y_B$ is the biaxial modulus of the substrate, and wherein $t_s$ and $t_f$ are the thicknesses of the substrate and of the film respectively.

Figure 3:
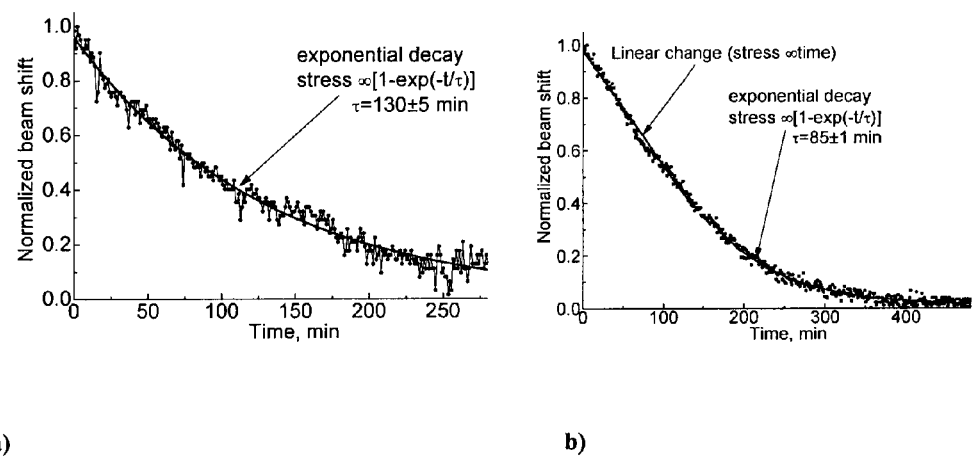

FIG. 3 demonstrates kinetics of the electromechanical response (a) after the first application of the voltage (−2V); and (b) after the second application of the voltage (+2V). Rate of stress change is shown. In this experiment, bias was applied to the test structures and the deflection of the beam (ΔD) reflected from the sample was recorded by a CCD camera as a function of time. The material responded to the applied bias, changed its curvature and the reflected beam shifted; Comparing FIG. 3(a) to FIG. 3(b) it can be seen that the test structure responded in the same manner to opposite voltages.

Figure 2A:
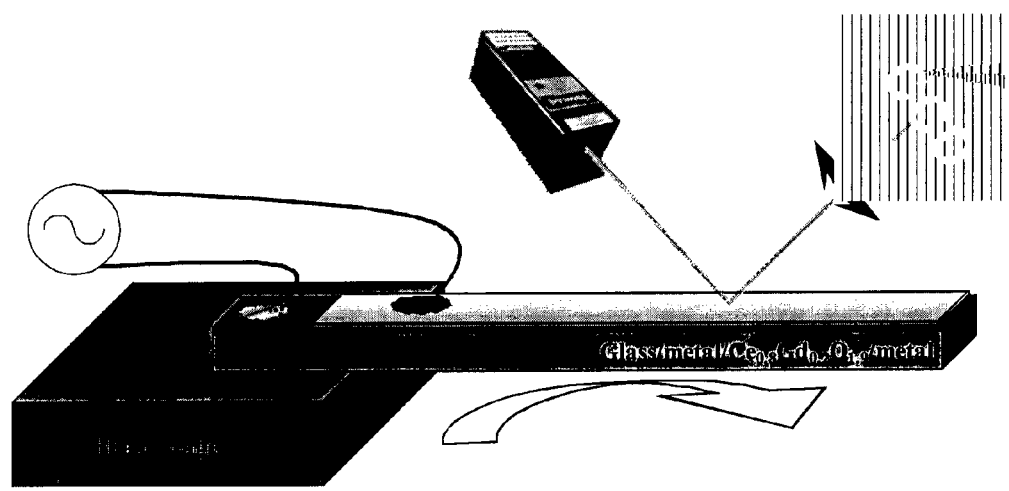
FIG. 2 is: (a) a scheme of a setup used to detect the electromechanical response in glass\metal\$Ce_{0.8}Gd_{0.2}O_{1.9}$\metal structures. (b) a scheme of a curvature measurement setup. The curvature is given by $$\kappa \approx \frac{1}{L} \cdot \frac{\Delta D}{\Delta d}.$$
Figure 2B:
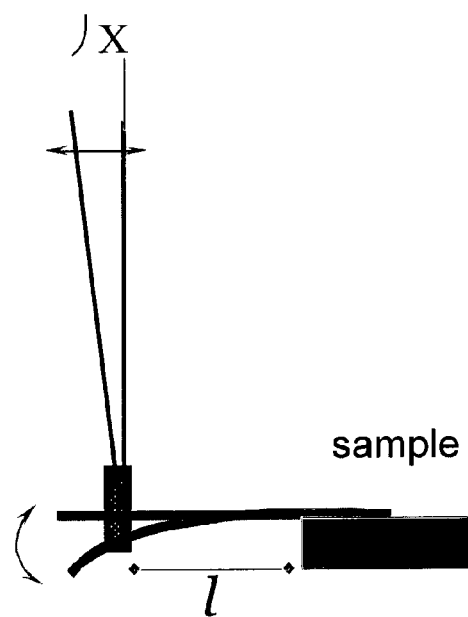
Figure 4:
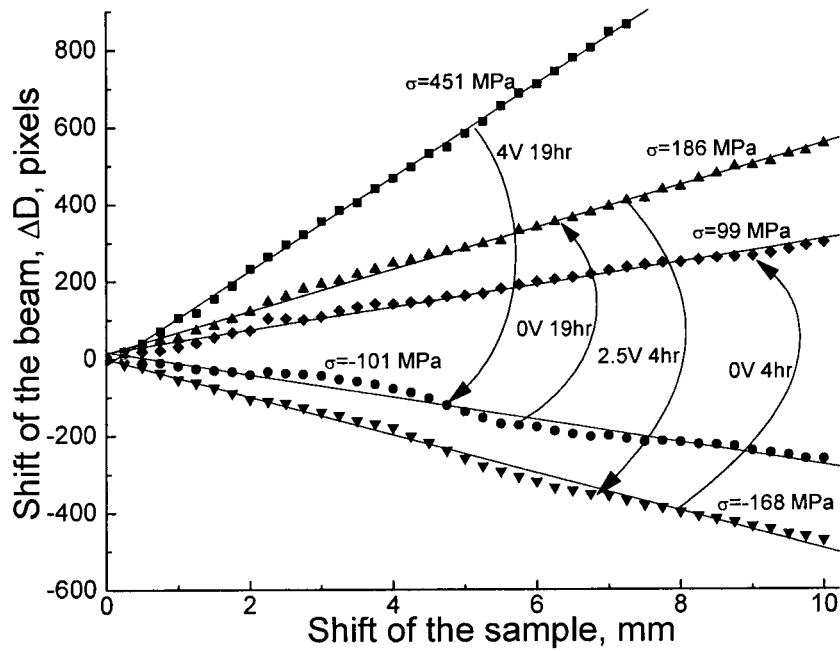

FIG. 4 demonstrates results from an experiment presented in FIG. 2, i.e. ΔD as a function of Δd. Each line corresponds to one measurement made after bias application and reflects the mechanical stress in a $Ce_{0.8}Gd_{0.2}O_{1.9}$ film. The mechanical stress changes each time a bias was applied and relieves back when the bias is off. The initial measurement (upper line) is recorded before any bias was applied; FIG. 4 demonstrates determination of substrate curvature by the setup. The fact that the lines are straight indicates that the substrate\electrode\$Ce_{0.8}Gd_{0.2}O_{1.9}$\electrode structure has an arc-shape, the radius of which changes under applied voltage homogenously. This proves that the stress in $Ce_{0.8}Gd_{0.2}O_{1.9}$ is homogeneous everywhere in the sample.

Figure 5:
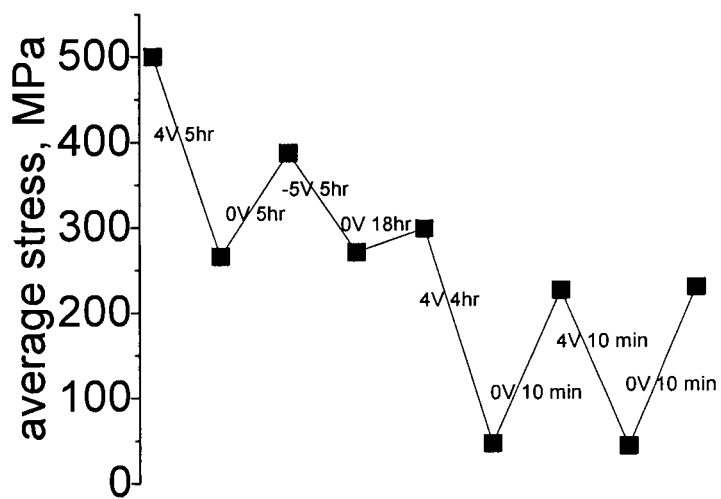

FIG. 5 demonstrates processed results from the experiment presented in FIG. 2 and in FIG. 4; i.e. stress in the film as a result of bias application. The mechanical stress changes each time the bias was applied and relieves back when the bias is off; the figure shows evolution of stress in a substrate\electrode\$Ce_{0.8}Gd_{0.2}O_{1.9}$\electrode structure and it can be seen that the characteristic response time drops to 10 min.

Figure 6:
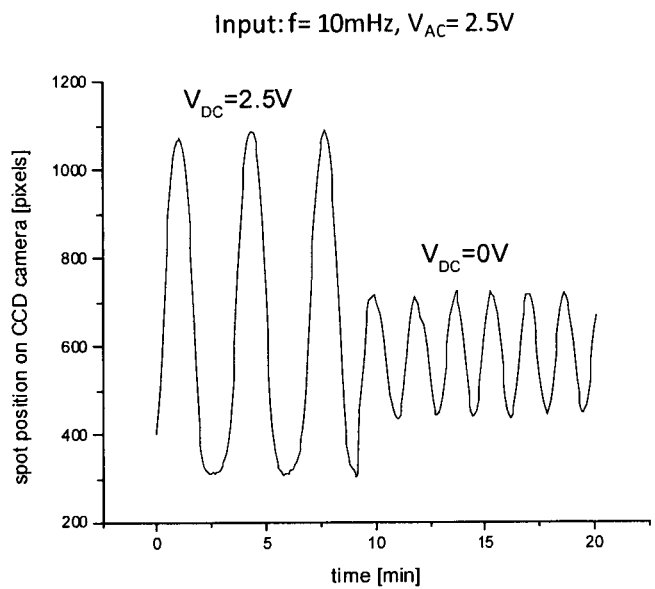

FIG. 6 depicts an electromechanical response measured in the reflected laser-beam experiment setup as described in FIG. 2. High response at the same frequency, as the applied AC bias, when $V_{DC}$=2.5V. Lower response at the doubled frequency when the $V_{DC}$ was switched off.

Figure 7:
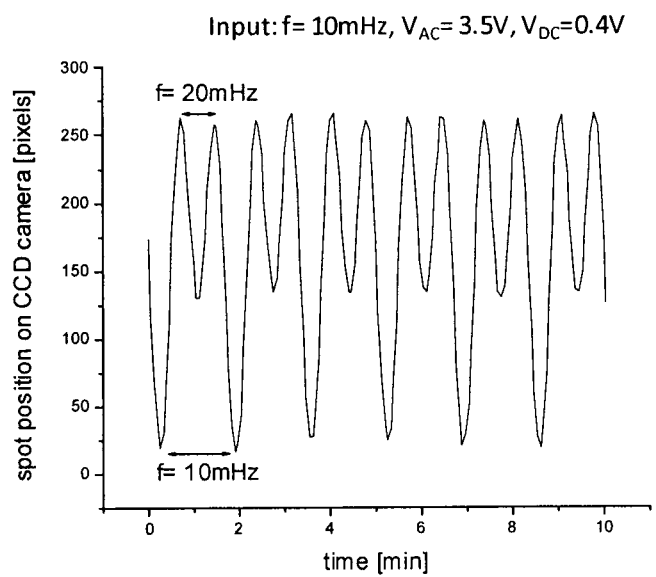

FIG. 7 depicts an electromechanical response for high $V_{AC}$ and low $V_{DC}$. Higher amplitude, associates with both $V_{AC}$ and $V_{DC}$, when the smaller peaks, with $V_{AC}$ only.

Figure 8:
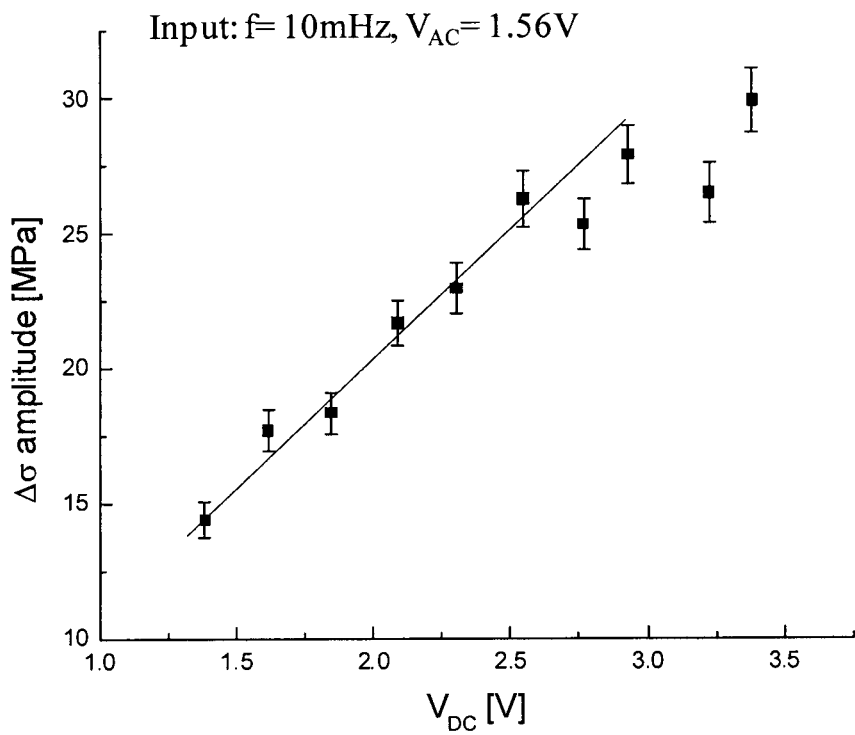

FIG. 8 depicts an electromechanical stress amplitude as a function $V_{DC}$, when $V_{AC}$ is fixed. The response was at $1^{st}$ harmonics, i.e. at f=10 mHz.

Figure 9:
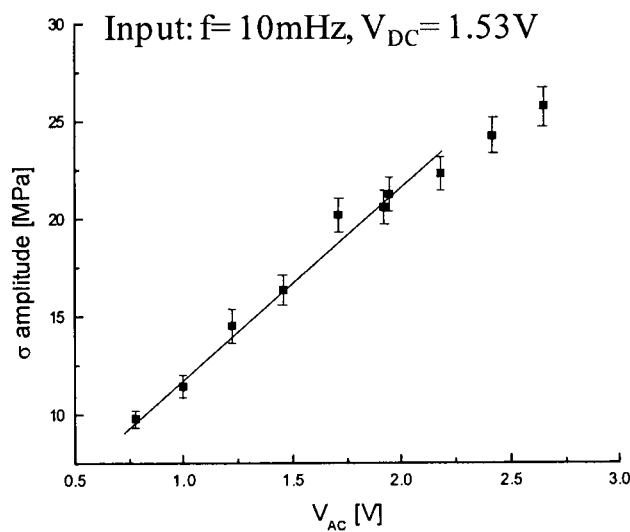

FIG. 9 depicts an electromechanical stress amplitude as a function $V_{AC}$, when $V_{DC}$ is fixed. $1^{st}$ harmonics.

Figure 10:
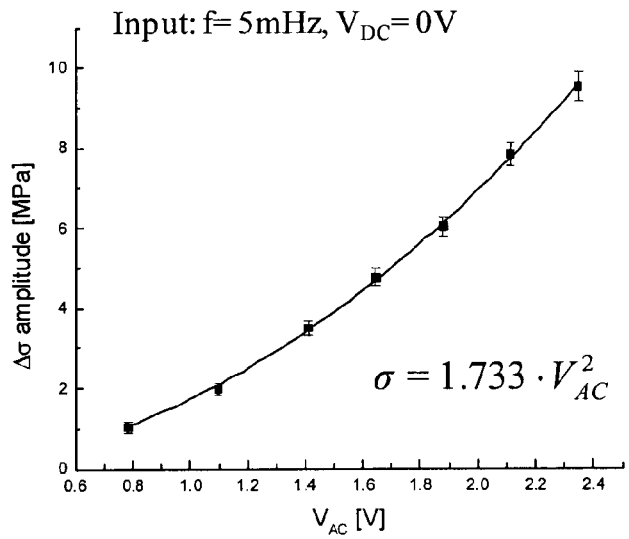

FIG. 10 depicts an electromechanical stress amplitude as a function $V_{DC}$, when $V_{AC}$ is fixed. The response was at $2^{nd}$ harmonics, i.e. at f=10 mHz.

Figure 11:
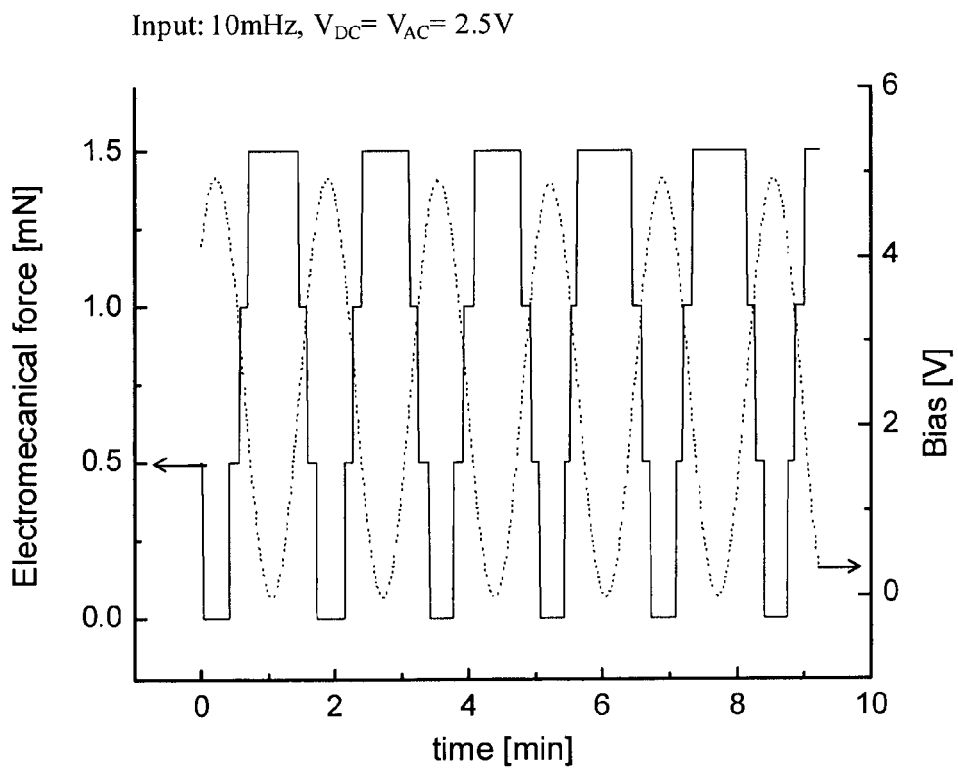

FIG. 11 depicts a direct force-gauge measurements. Left Y-axis and corresponding black curve—measured force; Right Y-axis and corresponding doted curve—applied bias profile.

Figure 12:
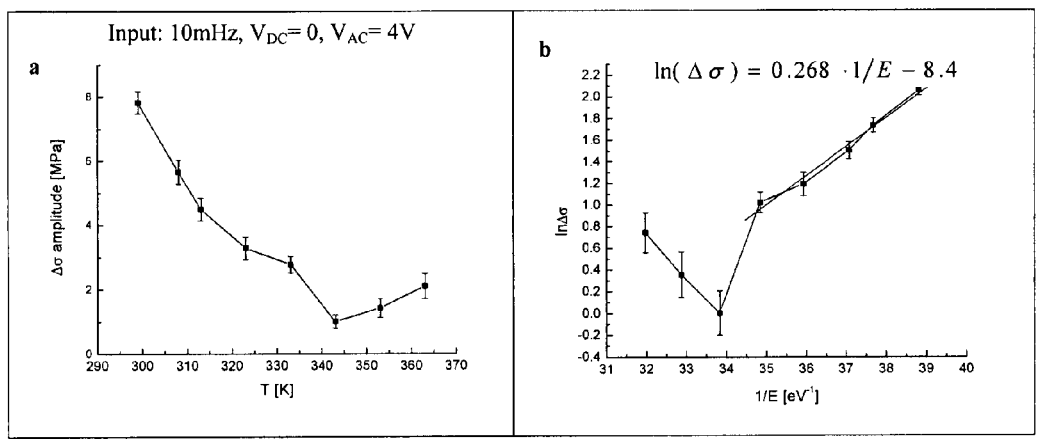

FIG. 12 depicts an electromechanical stress amplitude ($2^{nd}$ harmonic) as a function of temperature: FIG. 12a—as-measured data. FIG. 12b—Arrhenius-type plot with linear fitting for revealing energy of activation.

Figure 13:
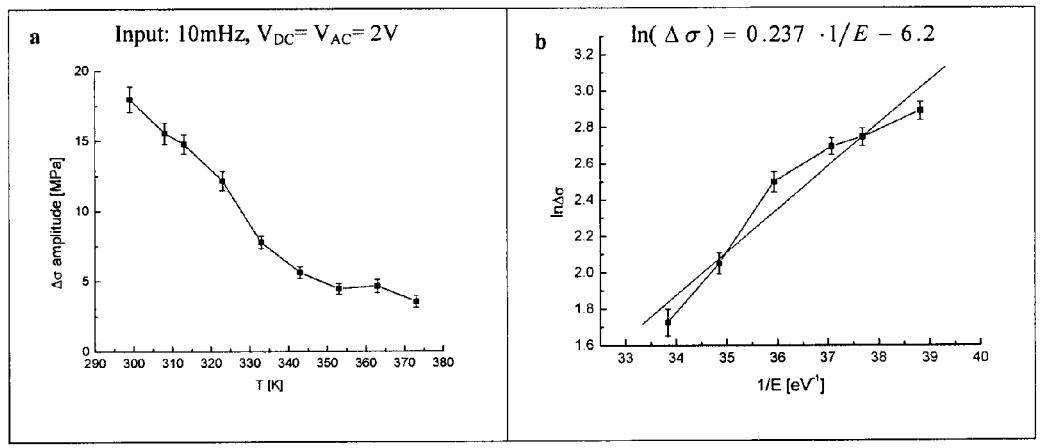

FIG. 13 depicts an electromechanical stress (1st harmonic) amplitude as a function of temperature: FIG. 13a—as-measured data. FIG. 13b—Arrhenius-type plot with linear fitting for revealing energy of activation.

Figure 14:
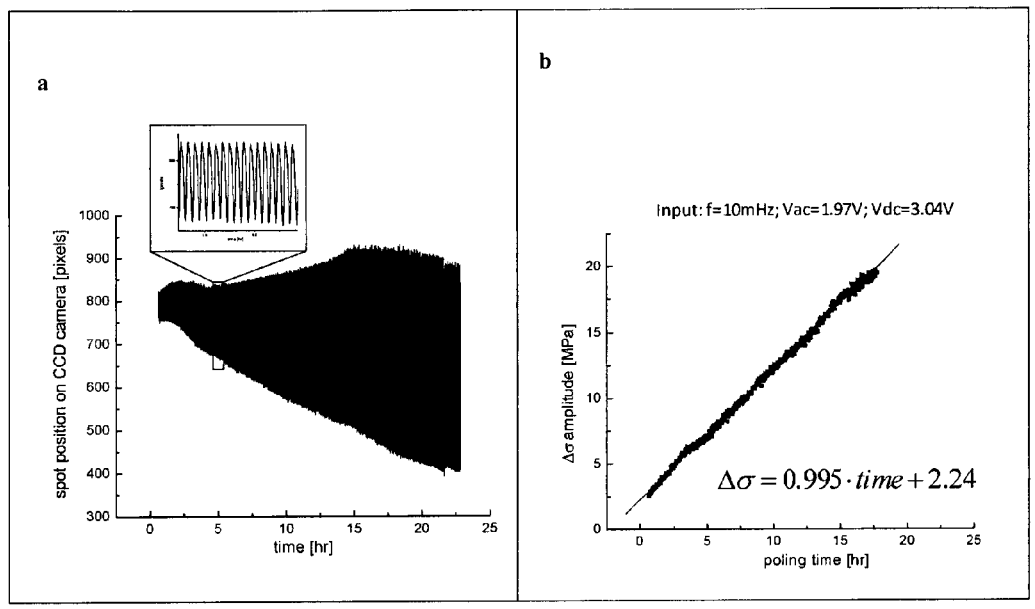

FIG. 14 depicts an in-situ monitoring of poling process (1st harmonic): FIG. 14a—as-measured data of electromechanical stress amplitude. Inset: close-up on electromechanical fluctuations. FIG. 14b—calculated by the following equations the stress amplitude during the poling. The curvature Δk of the reflective sample (for small changes) is calculated according to the following equation:

$$\Delta k = \frac{\Delta X}{2L \cdot l}$$

where: L—the optical path of the reflected laser beam from the sample to the CCD camera. l—the place on the sample, where the laser beam reflects from, measured from the clamped side. The change in curvature is translated to the change in electromechanical stress by Stoney's formula:

$$\Delta \sigma = \frac{Y_s}{1 - \nu_s} \frac{t_s^2}{6 t_f} \Delta k$$

Where: $Y_s$ and $\nu_s$ are Young modulus (~69 GPa) and Poisson's ratio (0.2) of the substrate (glass), $t_s$ and $t_f$ are the thicknesses of the substrate and film (CGO) respectively.

Figure 15:
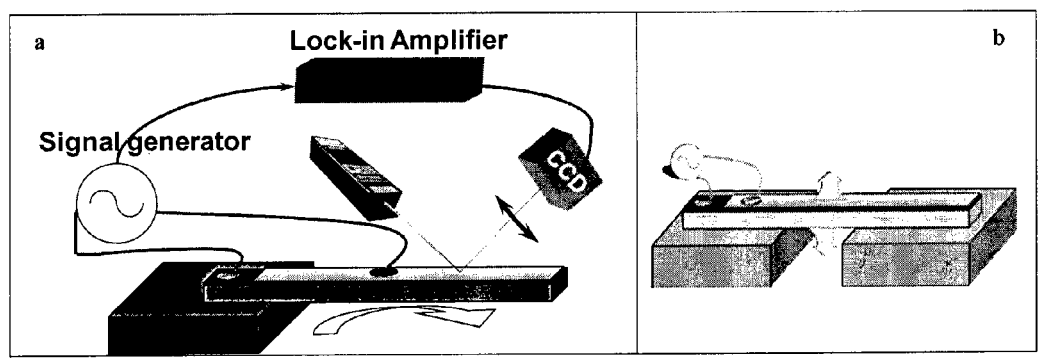

FIG. 15 depicts a frequency response setup. FIG. 15a—presents a single clamped mode. FIG. 15b—presents a double-clamped mode of sample connection.

Figure 16:
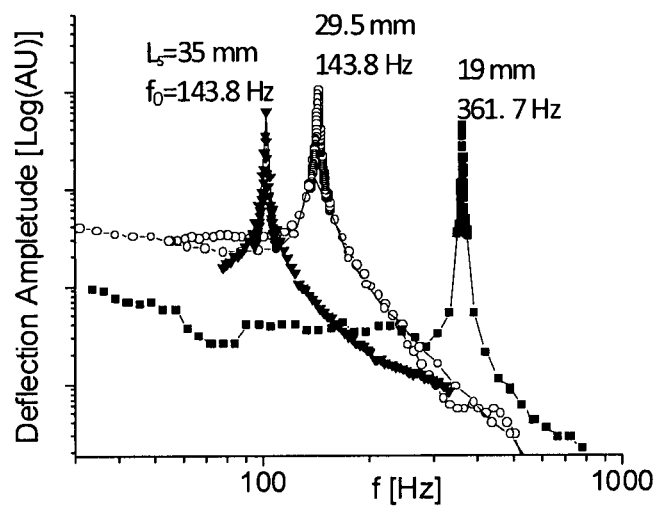

FIG. 16 depicts lock-in deflection amplitude as a function of applied bias frequency for three different cantilever lengths ($L_s$). Log-log chart. $1^{st}$ harmonics.

Figure 17:
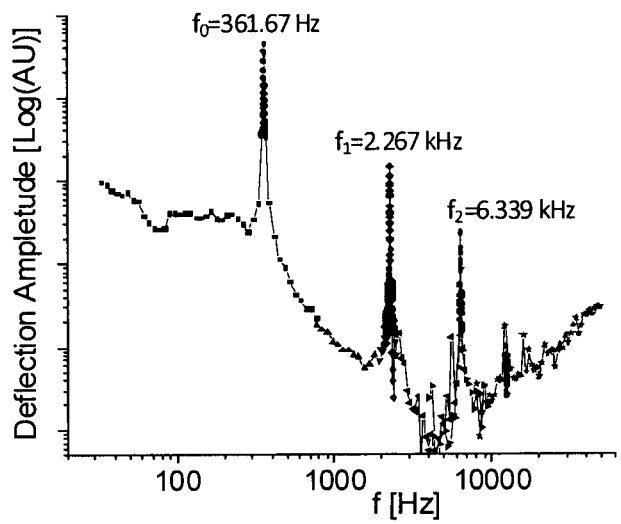

FIG. 17 depicts a first three mechanical resonances measured for $L_s$=19 mm. Log-log chart. $1^{st}$ harmonics, wherein the mechanical resonance frequency ($f_n$) is defined by Eq 5. in Example 6.

Figure 18:
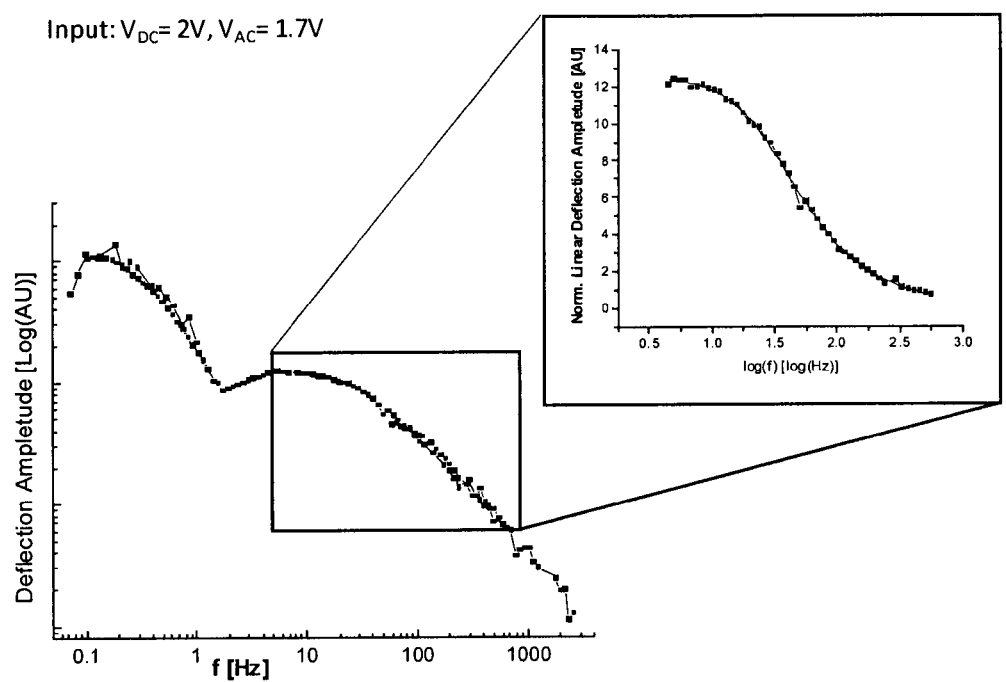

FIG. 18 depicts a lock-in deflection amplitude as a function of applied bias frequency for double-clamped beam mode. Log-log chart. $1^{st}$ harmonics. inset: semi-log chart with Debye-type relaxation fitting.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In one embodiment, this invention provides an electromechanical device comprising an active material wherein upon application of an electric field the active material generates large displacement, large stress or a combination thereof.

In one embodiment, the active material is a ceria based material. In another embodiment, the active material is $Ce_xGd_yO_z$ wherein x ranges between 0.95-0.63, y ranges between 0.05-0.37 and z ranges between 2-(y/2). In another embodiment, the active material comprising $Ce_{0.8}Gd_{0.2}O_{1.9}$. In another embodiment, the active material is $Ce_{0.8}Gd_{0.2}O_{1.9}$. In one embodiment, the active material develops stress upon application of the electric field. In one embodiment, electromechanical devices of this invention find use in any application in which piezoelectric materials or electrostrictive materials are currently used. In one embodiment, devices of this invention are applicable to any sensor and to any actuator that requires an electromechanical material. In one embodiment, electromechanical devices of this invention comprise active materials that can develop much larger stress and/or exhibit much larger displacement or deformation upon application of an electric field as compared with conventional piezoelectric or electrostrictive materials. In one embodiment, a certain degree of strain is required for the electric field-induced development of stress and/or for the electric-field induced displacement or deformation in active materials of this invention. In another embodiment, the active material is strain-free for the electric field-induced development of stress and/or for the electric-field induced displacement or deformation in active materials of this invention.

In one embodiment, strain in the active material can be generated by production of the material from its components by chemical or physical methods such as chemical reactions, precipitation from solutions, re-melting, phase separation and etc.

In one embodiment, strain in the active material can be generated by production or forming of the device or the active material from unstrained/non-active material by chemical or physical or material engineering methods such as: evaporation, CVD, PVD, depositions from gel or solutions, powder metallurgy techniques, deposition from liquid or gas phases, sintering and any other method known to a person of ordinary skill in the arts.

In one embodiment, strain in the active material can be generated by inducing strain into unstrained/non-active material to make active material using heat treatments such as annealing, tempering, quenching and similar processes.

In one embodiment, strain in the active material can be generated by inducing strain into unstrained/non-active material to make active material by mechanical methods such as pulling, bending, compressing, twisting etc.

In one embodiment, the elastic modulus of $Ce_{0.8}Gd_{0.2}O_{1.9}$ can be modulated by applying an external electric field. In one embodiment, the electric field is constant (DC). In another embodiment the electric field is alternating (AC). In another embodiment, the electric field is a combination of AC and DC.

In one embodiment, the active material layer in a substrate\electrode\$Ce_{0.8}Gd_{0.2}O_{1.9}$ \electrode structure (or conductive substrate\$Ce_{0.8}Gd_{0.2}O_{1.9}$\electrode) develops a stress of 0.5 GPa under applied electrical field of 150 kV/cm. In one embodiment, the active material layer in a substrate\electrode\$Ce_{0.8}Gd_{0.2}O_{1.9}$\electrode structure (or conductive substrate\$Ce_{0.8}Gd_{0.2}O_{1.9}$ \electrode) develops stresses ranging between 0.1-1 GPa under applied electrical fields of 5-200 kV/cm. In one embodiment, the active material layer in a substrate\electrode\$Ce_{0.8}Gd_{0.2}O_{1.9}$ \electrode structure (or conductive substrate\$Ce_{0.8}Gd_{0.2}O_{1.9}$\electrode) develops a stress according to Example 2 and FIGS. 8, 9 and 10.

In one embodiment, the electromechanical response is observed in films of this invention with initial in-plane strain of 0.1%<u<0.4% having a characteristic response time from a few hours to a few minutes. In one embodiment, the electromechanical response is observed in films of this invention with initial in-plane strain of 0.1%<u<0.6%. In another embodiment, the electromechanical response is observed in stain-free films of this invention. In one embodiment, the response time may comprise the "forming step" (like poling in piezoelectrics), which can take 1-10 hours, and further comprise "fast response" after forming, which can be 1 sec 15 min. In one embodiment, the observed electromechanical response originates in the change in the elastic modulus rather than in long range diffusion. In one embodiment, change in elastic modulus means change in the interatomic forces and can be achieved by small movement, shift or reorientation of atoms, without involving translation of matter or diffusion. In one embodiment, tailoring of elastic modulus of the active material by the electric-field induced rearrangement of point defects generates an electromechanical response.

Practical Implications.

In one embodiment, the active material of this invention which are ionic conductors possess elastic dipoles because they contain concentrations of point defects that are comparable with the concentration of ions in the lattice (for instance in $Ce_{0.8}Gd_{0.2}O_{1.9}$ 5% of oxygen sites are empty). In addition most ionic conductors contain aliovalent or homovalent dopants that cause local lattice distortions. According to this aspect and in one embodiment, "alio" means different, "homo" means the same, i.e. dopants with valence different or equal to the host. Homovalent dopants may cause local lattice distortions due to size difference. The high mobility of ions and low electronic conductivity in these materials imply that the elastic dipoles may rearrange under an external field. Therefore, modification of elastic properties of the active materials of this invention (ionic conductors) by an external field may be observed in non limiting examples such as doped or undoped $ZrO_2$, $CeO_2$, $Bi_2O_3$, and oxides of Sr, La, Fe, Co in one embodiment.

The limitation of piezoelectric and electrostrictive materials (either small displacement or small stress) is not applicable to the described effect. The stress of $Ce_{0.8}Gd_{0.2}O_{1.9}$ is defined by the changes in the elastic modulus of $Ce_{0.8}Gd_{0.2}O_{1.9}$, where the displacement is defined only by geometrical factors (lengths of the sample for the scheme in FIG. 2). Therefore, the observed effect is a qualitatively different type of electromechanical response. In one embodiment, $Ce_{0.8}Gd_{0.2}O_{1.9}$ cannot be piezoelectric or electrostrictor due to its lattice symmetry and low dielectric constant. Therefore, the observed effect is a qualitatively different type of electromechanical response. Meaning that the limitation of piezoelectric and electrostrictive materials (either small displacement or small stress) is not applicable to the described effect, and higher performances can be achieved by devices and methods of this invention.

DEFINITIONS

In one embodiment, an electromechanical device of this invention is a device that exhibits a mechanical change upon the application of an electric field. In one embodiment, an electromechanical device is a mechanical device that is operated by electricity. In one embodiment, an electromechanical effect is the effect underlying an electrically operated mechanical device. In one embodiment, an electromechanical effect is the effect of electricity (an electric field) on a mechanical property of a material. In one embodiment, an electromechanical effect can be described as deformation, as a change in shape, geometry, density, length, width, thickness, bending, curvature, porosity, rigidity, flexibility, stress or a combination thereof as a function of applied electric field on the material. In one embodiment, the effect as demonstrated by the material is parallel to the direction of the electric field. In one embodiment, the effect is perpendicular to the electric field. In one embodiment, the effect is exhibited both parallel and perpendicular to the electric field. In one embodiment, the effect along one direction (one axis) in the material is different from the effect along another direction in the material. In one embodiment, the effect is better pronounced at the surface of the material. In one embodiment, the effect is a bulk effect. In one embodiment, the electromechanical effect is reversible, i.e. application of electric field creates the effect; turning off the electric field the effect disappears.

In one embodiment, an active material is the material responsible for the electromechanical effect. In one embodiment, the active material is the material that undergoes a mechanical change as a response to an applied electric field.

In one embodiment, displacement is a change in the position of the active material or portions thereof. In one embodiment, displacement means change of location, change of the coordinates of the active material or portions thereof. In one embodiment, displacement describes the movement of the active materials or portions thereof as a result of an applied electric field. In one embodiment, a displacement is observed as change in length, increased or decreased curvature, bending or increase/decrease in bending, elongation, shrinkage, change in volume, change in width, or any other change in the dimensions or in the geometry of the active material or portions thereof. In one embodiment, force is exerted by the active material upon application of an electric field. In one embodiment, force is developed in the active material. In one embodiment, when the active material is under the influence of an electric field, the active material can resist an external force. In one embodiment, the active material of this invention generates a mechanical force as presented in Example 3.

In one embodiment, deformation is a change in dimensions of a material. In one embodiment, deformation is equivalent to or comprising displacement as descried herein above.

In one embodiment, strain is the amount of deformation a material experiences per unit of original length in response to stress. In one embodiment, in-plane strain is the strain within the thin film directed perpendicular to the smallest dimension of the film. In one embodiment, the in-plane strain in thin films can be described as follows: in the thin film technology, due to the fact that thin films have one dimension much smaller than two others, most properties can be roughly divided to two classes: in-plane & out-of-plane. The in-plane parameters refer to the parameters directed perpendicular to the "thin" or to the smallest dimension of the thin film. In one embodiment, in-plane strain is the strain within the thin film or within the active material.

In one embodiment, elastic modulus is the ratio of stress, within the proportional limit, to the corresponding strain. In one embodiment, elasticity is the tendency of a material to return to its original shape after it has been stretched or compressed.

In one embodiment, pm represents units of picometers. In one embodiment, nm represents units of nanometers. In one embodiment, MPa represents units of Mega Pascal. In one embodiment, V represents Volts. In one embodiment, μm represents micrometers.

In one embodiment, stress is the force that a material is subjected to per unit of original area. In one embodiment, stress in materials of the invention depends on voltage (bias/electric field) applied.

In one embodiment, contacts are conducting contacts. In one embodiment, the conducting material from which the contacts are made comprising metal. In one embodiment, the conductive contacts comprise any other material with metal-like conductivity, such as conductive oxides, highly-doped semiconductors or conductive polymers.

In one embodiment, a substrate is the supporting structure of the device. In one embodiment, the substrate is the material on which or in which the device is built. In one embodiment, the substrate is a piece of material from which the device or portions of it will be made. In one embodiment, the substrate comprising is pyrex, silicon dioxide, silicon nitride, quartz or SU-8. In one embodiment, the substrate comprising glass. In one embodiment, the substrate is coated. In one embodiment, the substrate, comprising silicon. In one embodiment, the substrate, comprising a polymer. In one embodiment, the polymer is PDMS. In one embodiment, the substrate width/length/diameter or any other surface dimension equals or is similar in size to the surface dimensions of the active material. In one embodiment, the surface of the substrate is larger than the surface of the active material. In one embodiment, the substrate is comprised of a transparent material. In another embodiment the substrate is conductive. In another embodiment, if the substrate is conductive there is no need for a first conductive layer (i.e electrode) and the active material is formed directly on the conductive substrate. In another embodiment conductive substrate is a metal, graphite, low-resistance semiconductor, conductive ceramic, conductive polymer/plastic.

In one embodiment, the substrate is curved when the active material and conductive contacts layers are formed in contact with the substrate according to embodiments of the invention. In one embodiment, the radius of curvature of the substrate follows the radius of curvature imposed by the strain/stress in the active material. In one embodiment, as a result of the application of voltage (application of an electric field), the curvature of the substrate may change.

In one embodiment, radio frequency magnetron sputtering is a physical vapor deposition (PVD) method of depositing thin films by sputtering, that is ejecting material from a "target", (a source of material), which then deposits onto a substrate. In one embodiment, target composition is the same as the composition of the active material, i.e. $Ce_{0.8}Gd_{0.2}O_{1.9}$ in one embodiment. In one embodiment, the sputtering process can be performed in vacuum of 5-100 millitorr, in presence of Ar, $O_2$, or a mixture of Ar and $O_2$. In one embodiment, the electrical power of a power supply used for radio frequency sputtering may be 50-300 watt.

In one embodiment, an electric field is the space surrounding an electric charge. In one embodiment, the electric field exerts a force on other electrically charged objects. In one embodiment, a stationary charged particle in an electric field experiences a force proportional to its charge. In one embodiment, an electric field can be induced by applying a voltage. In one embodiment, an electric field can be induced in the area between two electrodes to which an unequal voltage is applied. In one embodiment, certain distribution of positive or negative charges in space can give rise to an electric field.

In one embodiment, devices used in methods of this invention are made by deposition, evaporation or sputtering processes or a combination thereof. In one embodiment further methods used in the preparation of devices of the invention comprise lithography and etching processes, electron beam deposition/evaporation, thermal evaporation, electrochemical deposition, stamping, imprinting, and any other conventional processes used in e.g. the semiconductor fabrication industry as will be known to a person skilled in the art.

In one embodiment, a sensor is a device that measures a physical quantity and converts it into a signal which can be read by an observer or by an instrument.

In one embodiment, an actuator is a mechanical device for moving or controlling a mechanism or system, by converting the electrical energy to mechanical energy. In one embodiment, an actuator comprising electrical motors, electrical pumps and valves. In one embodiment, an actuator actuates electrical motors, electrical pumps and valves. In one embodiment, the actuator activates, triggers, sets in motion, puts into action and/or starts a device, a system an apparatus or portions thereof.

In one embodiment, a power supply is used for the generation of an electric field. In one embodiment, connectors or wires from the power supply are connected to the conductive contacts of the active material in devices of the invention.

In one embodiment, the active material is represented by $Ce_xGd_yO_z$. In one embodiment, x, y, and z represent the concentrations of each ion in the crystal.

Materials, Dimensions and Values

In one embodiment, the active material is ceria-based material. In another embodiment, the active material is $Ce_xGd_yO_z$ wherein x ranges between 0.95-0.63, y ranges between 0.05-0.37 and z ranges between (2-(y/2)). In one embodiment, x=0.8, y=0.2 and z=1.9. In one embodiment, if y=0.2, then z=1.9. In one embodiment, the active material comprising doped or undoped $ZrO_2$, $CeO_2$, $Bi_2O_3$, oxides of Sr, La, Fe, Co or combinations thereof. In one embodiment, x, y and z denotes the relative concentrations of each ion in the solid.

In one embodiment, active materials of this invention comprise derivatives of $CeO_2$. In one embodiment, the general formula for such derivatives is $Ce_xM_yO_{(2-delta)}$ wherein $0<x<1$, $0<=y<1$, $0<=delta<1$, and wherein M is any metal that has a valency less than or equal to 4, i.e., any metal that causes vacancy formation or promotes oxygen deficiency if introduced into $CeO_2$. For instance and in one embodiment, M may be any of all lanthanides, Ca, Ma, Sr, Fe, Y, Sc, Zr, Ti, Ni, Co or combinations thereof. In one embodiment, active materials of the invention may comprise more than one dopant (i.e. M as described herein above) as long as the material preserves local fluorite-like structure. The macroscopic structure is less important as long as the local arrangement is preserved.

The active materials and the dopants as described herein above is also relevant to $ZrO_2$ and $BiO_{1.5}$ (i.e $Bi_xM_yO_{1.5-delta}$ $Zr_xM_yO_{1.5-delta}$—$Bi_2O_3$, wherein 1.5-delta replaces 2-delta in the above formula for $Ce_xM_yO$). The active materials and the dopants as described herein above are also relevant to all lanthanides that form a fluorite-like structure.

In one embodiment, any active-material structure with large concentration of vacancies may exhibit similar effect as long as the material has low electrical conductivity ($<10^6$ S/cm). Such materials include but are not limited to halogenides (salts of F, Cl, Br and I) and sulfides. For instance, $CaF_2$ in which some Ca are replaced by a monovalent cation.

In one embodiment, active materials of this invention comprise any metal oxide of the general formula $MO_{1.5}$, wherein M is trivalent metal and wherein some of the cations are partially or completely replaced by another divalent or trivalent metal or their combination. For instance, Sr-doped $La_2O_3$, or oxides of La, Sr, Co, Fe in any proportion.

In one embodiment, the piezoelectric coefficient in materials of this invention is about 100 A/V, in a material with elastic modulus >100 GPa.

In one embodiment, the substrate of this invention comprising glass. In one embodiment, the substrate comprising a polymer. In one embodiment, the substrate comprising PDMS or teflon.

In one embodiment, the thickness layer of the active material ranges between 500 nm and 1000 nm. In one embodiment, the thickness layer of the active material is 500 nm. In one embodiment, the thickness layer of the active material ranges between 500 nm and 750 nm. In one embodiment, the thickness layer of the active material ranges between 750 nm and 1000 nm. In one embodiment, the thickness layer of the active material ranges between 100 nm and 1000 nm. In one embodiment, the thickness layer of the active material ranges between 500 nm and 2000 nm. In one embodiment, the thickness layer of the active material ranges between 400 nm and 4000 nm. In one embodiment, the thickness layer of the active material ranges between 600 nm and 800 nm. In one embodiment, the thickness layer of the active material ranges between 1000 nm and 10,000 nm. In one embodiment, the thickness layer of the active material ranges between 10,000 nm and 100,000 nm.

In one embodiment, the length and width of the active material equal. In one embodiment, the length of the active material is larger than the width of the active material. In one embodiment, the length and the width of the active material are larger than the thickness (height) of the active material. In one embodiment, the length of the active material is four centimeters and the width of the active material is 0.8 cm.

In one embodiment, the length of the active material, the width of the active material or a combination thereof ranges between 0.5 cm and 5 cm. In one embodiment, the length of the active material, the width of the active material or a combination thereof ranges between 0.1 cm and 1 cm. In one embodiment, the length of the active material, the width of the active material or a combination thereof ranges between 1 cm and 10 cm. In one embodiment, the length of the active material, the width of the active material or a combination thereof ranges between 10 cm and 100 cm. In one embodiment, the length of the active material, the width of the active material or a combination thereof ranges between 0.01 cm and 0.1 cm. In one embodiment, the length of the active material, the width of the active material or a combination thereof ranges between 10 micrometer and 100 micrometers. In one embodiment, the length of the active material, the width of the active material or a combination thereof ranges between 1 micrometer and 10 micrometers. In one embodiment, the active material is in the form of a disc. In one embodiment, the diameter of the disc may comprise any value as described herein above for the width/length of square/rectangular active materials. In one embodiment, the thickness of the disc is any value described herein above for the thickness of the active material. In one embodiment, the active material may comprise any geometrical shape, or it can be of an undefined or partially defined geometry. In cases where the geometry of the active material is not well-defined, the values described herein above for length/width and thickness may represent the largest and/or smallest dimensions of the active material.

In one embodiment, the density of the active material ranges between 7.2-7.7 g/cm$^3$. In one embodiment, the dielectric constant of the active material ranges between 20-28. In one embodiment, the Young's modulus of the active material ranges between 200-250 GPa.

In one embodiment, the contacts of this invention are made of a conducting (conductive) material. In another embodiment, a contact is an electrode. In another embodiment, the first layer deposited on the substrate is a contact or an electrode. In one embodiment, the contacts comprising metal. In one embodiment the metal is Cr. In one embodiment, the metal comprising Al, Cr, Mo, Ag, Au, Ti or a combination thereof. In one embodiment, any metal can be used to form the conductive contacts. In one embodiment, the contacts comprising a metal alloy. In one embodiment, any other material with metal-like conductivity, such as conductive oxide, highly-doped semiconductor or a conductive polymer may be used for the contacts in embodiments of this invention. In another embodiment, the contact is a metal, graphite, low-resistance semiconductor, conductive ceramic, conductive, polymer/plastic or combination thereof. In one embodiment, if the substrate is conductive, there is no need for the first electrode and the active material is deposited directly on the conductive substrate. In another embodiment, a conductive substrate is also a contact.

In one embodiment, the thickness of at least one contact is 100 nm. In one embodiment, the thickness of at least one contact ranges between 50 nm and 150 nm. In one embodiment, the thickness of at least one contact is 500 nm. In one embodiment, the thickness of at least one contact ranges between 30 nm and 300 nm. In one embodiment, the thickness of at least one contact is 1000 nm. In one embodiment, the thickness of at least one contact ranges between. In one embodiment, the thickness of at least one contact is 100 nm. In one embodiment, the thickness of at least one contact ranges between 100 nm and 500 nm. In one embodiment, the thickness of at least one contact is 200 nm. In one embodiment, the thickness of at least one contact ranges between 70 nm and 130 nm. In one embodiment, the thickness of at least one contact is 20 nm. In one embodiment, the thickness of at least one contact ranges between 50 nm and 1000 nm. In one embodiment, the thickness of at least one contact is the minimum thickness of a certain metal (or other conductive material) that will provide a good electrical contact. In one embodiment, the thickness of the two contacts is the same. In one embodiment, the thickness of each contact is different.

In one embodiment, the contacts cover the full surface of the active material. In one embodiment, the contacts cover only portions of the active material surface. In one embodiment, the two contacts comprising the same material. In one embodiment, each of the two contacts comprising a different material.

In one embodiment, materials of the invention are centrosymmetric with a low dielectric constant. In one embodiment, materials of the invention can not be defined as classical piezoelectrics and can not be defined as classical electrostrictive materials. In one embodiment, the active material can display the electromechanical properties as a thin film. In one embodiment, the active material can display the electromechanical properties as a bulk material. In one embodiment, because the active material is evaporated (sputtered) on a different material, the active material will be strained. In one embodiment, bending of the active material, bending and fixing the bent active material to another material or to a holder, stretching the active material and fixing it to another material, all such actions may generate in-plane strain in the active material.

In one embodiment, active materials of this invention generate both large force and large displacement upon application of an electric field. In one embodiment, stress and displacement in active materials of the invention in response to electric field are ten times higher than stress and force generated by conventional electromechanical materials.

In one embodiment, the stress developed in active materials of this invention ranges between 100 MPa and 500 MPa. In one embodiment, the stress developed in active materials of this invention ranges between 1 MPa and 100 MPa. In one embodiment, the stress developed in active materials of this invention ranges between 1 MPa and 10 MPa. In one embodiment, the stress developed in active materials of this invention ranges between 100 MPa and 1000 MPa. In one embodiment, the stress developed in active materials of this invention ranges between 500 MPa and 2000 MPa. In one embodiment, the stress developed in active materials of this invention ranges between 50 MPa and 1000 MPa. In one embodiment, the stress developed in active materials of this invention ranges between 100 MPa and 5000 MPa. In one embodiment, the stress developed in active materials of this invention ranges between 500 MPa and 1500 MPa. In one embodiment, the stress developed in active materials of this invention depends on the applied electric field.

In one embodiment, displacement in active materials of this invention ranges between 50 pm/V and 150 pm/V. In one embodiment, displacement in active materials of this invention ranges between 10 pm/V and 150 pm/V. In one embodiment, displacement in active materials of this invention ranges between 10 pm/V and 50 pm/V. In one embodiment, displacement in active materials of this invention ranges between 100 pm/V and 1000 pm/V. In one embodiment, displacement in active materials of this invention ranges between 100 pm/V and 500 pm/V. In one embodiment, displacement in active materials of this invention ranges between 100 pm/V and 1500 pm/V. In one embodiment, displacement in active materials of this invention ranges between 50 pm/V and 300 pm/V. In one embodiment, displacement in active materials of this invention ranges between 500 pm/V and 1000 pm/V. In one embodiment, the displacement in active materials of this invention depends on the applied electric field.

In one embodiment, active materials of this invention generate both large stress and large displacement (or deformation). According to this aspect and in one embodiment, combination of any range described herein above for stress values and any range described herein above for displacement values can describe values of displacement and stress in active materials of the invention.

The electromechamical response using the active material of this invention is described by electrostriction formalism, i.e. it proportional to square of electric field as presented in Equation 1:

$$\sigma \propto \{V_{AC} \cdot \cos(2\pi f t) + V_{DC}\}^2 = V_{DC}^2 + \frac{V_{AC}^2}{2} + 2V_{AC} \cdot V_{DC} \cdot \cos(2\pi f t) + \frac{V_{AC}^2}{2}\cos(2 \cdot 2\pi f t)$$

frequency f, $V_{AC}$-bias (volts), $V_{DC}$-bias (volts).

In one embodiment, the electromechamical effect dependent on the internal strain. In another embodiment, the electrochemical effect is provided in strain-free samples of this invention.

The electromechanical effect is influenced by electron conductivity of the ceria-based material or by the impedance of the experimental setup and/or test structures.

In one embodiment, in order to apply an electric field, the conductive contacts are connected to a power supply. In one embodiment, voltage is applied by the power supply to the device in order to generate the electric field. In some embodiments, the voltage is referred to as "bias". In one embodiment, the electric field is constant (DC). In another embodiment the electric field is alternating (AC). In another embodiment, the electric field is a combination of AC and DC.

In one embodiment, the voltage that is applied to the device is ±2V. In one embodiment, the voltage that is applied to the device ranges between 0V and ±4V. In one embodiment, the voltage that is applied to the device ranges between 1V and ±4V. In one embodiment, the voltage that is applied to the device ranges between 1V and ±5V. In one embodiment, the voltage that is applied to the device ranges between 0.01V and ±10V. In one embodiment, any voltage or voltage range that will generate the electromechanical effect in devices of this invention may be applied to devices of this invention. In one embodiment, voltage may be applied continuously. In one embodiment, voltage application can be pulsed. In one embodiment voltage can be direct voltage and in another embodiment, voltage may be alternating voltage. In one embodiment, the voltage applied may be switched on and off. In one embodiment, switching the voltage ON and OFF at constant time intervals and in another embodiment, in different time intervals. In one embodiment, the voltage applied is constant. In one embodiment, the voltage applied is not constant. In one embodiment, the voltage applied is gradually increased or gradually decreased.

In one embodiment, if the active material is curved with a positive curvature, application of an electric field may change the curvature of the material such that it will become a negative curvature and vice versa. In one embodiment, the radius of curvature of the active material (and/or the radius of the support/substrate/contacts) will change upon application of an electric field, but the direction (sign) of the curvature will remain the same.

Devices of the Invention

In one embodiment, this invention provides an electromechanical device comprising an active material wherein upon application of an electric field said active material generates displacement, stress or a combination thereof.

In one embodiment, this invention provides an electromechanical device comprising an active material wherein upon application of an electric field said active material generates large displacement, large stress or a combination thereof.

In one embodiment, this invention provides an electromechanical device comprising a ceria-based material wherein upon application of an electric field said active material generates large displacement, large stress or a combination thereof.

In one embodiment, the in-plane strain of the active material ranges between 0.1%-0.4%. In another embodiment. The active material is strain free, In one embodiment, the active material comprising metal oxide. In another embodiment, the active material is ceria-based material. In one embodiment, the metal oxide is doped by a metal ion. In one embodiment, the metal ion is Gd. In one embodiment, the active material comprising $Ce_xGd_yO_z$. In one embodiment, the $Ce_xGd_yO_z$ is $Ce_{0.8}Gd_{0.2}O_{1.9}$.

In one embodiment, x ranges between 0.95-0.63, y ranges between 0.05-0.37 and z ranges between 2-(y/2). In one embodiment, the displacement is at least 100 pm/V. In one embodiment, the stress developed in the active material upon application of the electric field is at least 100 MPa. In one embodiment, the active material comprising doped $ZrO_2$, $CeO_2$, $Bi_2O_3$, oxides of Sr, La, Fe, Co or a combination thereof.

In one embodiment, the active material further comprises any metal ion as a dopant. In one embodiment, the metal ion comprising a Lanthanide ion.

In one embodiment, the device further comprises conductive contacts. In one embodiment, the contacts comprising metal. In one embodiment, the metal contacts comprising Cr, Al, Ag, Ti or combination thereof. In one embodiment, the thickness of the metal contacts ranges between 50 nm and 150 nm. In one embodiment, the device is supported by a substrate. In another embodiment, if the substrate is conductive, it is used as a contact.

In one embodiment, the substrate comprising glass. In one embodiment, the thickness of the glass ranges between 50 micrometers and 500 micrometers.

In one embodiment, the active material layer is formed by radio frequency magnetron sputtering. In one embodiment, the thickness of the active material layer ranges between 0.35 and 1.0 micrometers.

In one embodiment, this invention provides a sensor comprising a device, wherein the device is an electromechanical device comprising an active material of this invention wherein upon application of an electric field the active material of this invention generates displacement, stress or a combination thereof.

In one embodiment, this invention provides an actuator comprising a device, wherein the device is an electromechanical device comprising an active material of thios invention wherein upon application of an electric field the active material of this invention generates displacement, stress or a combination thereof.

In one embodiment, the electromechanical effect in devices of this invention reflects the electromechanical interaction between the mechanical and the electrical states in the active material. In one embodiment, the electromechanical effect in devices of the invention is reversible. In one embodiment, devices of this invention exhibit the effect of internal generation of a mechanical force resulting from an applied electrical field.

In one embodiment, the active material will deform when an external electric field is applied to the active material.

In one embodiment, electromechanical devices of this invention find use in applications such as frequency standards, pressure wave generators in air and in water e.g. sound generators.

In one embodiment, this invention provides an electric field sensor.

In one embodiment, this invention provides an actuator such as in translation stages, motors, artificial muscles and all other actuator systems wherein conventional piezoelectrics and electrostrictors are currently used.

In one embodiment, when the dimensions of the device or portions thereof are in the micrometer and/or nanometer range, the device may find use in microelectromechanical (MEM) devices such as MEM sensors and actuators. In one embodiment, devices of this invention may find use in electronics, optoelectronics, as components in the semiconductor industry, in micro- and nano-technology. In one embodiment, devices of the invention may be used in medical devices. In one embodiment, devices of the invention may find use in biotechnology. In one embodiment, devices of this invention may be applied to controlled drug release.

In one embodiment, application of electric field will cause displacement in devices of the invention such that portions of the device will push, pull, trigger or start a mechanical component. In one embodiment, such mechanical component is stationary. In one embodiment, the mechanical component is in motion. In one embodiment, the interaction of the component with devices of the invention, puts the component into motion, or in another embodiment, devices of the invention restrict or stop movement of mechanical components. In one embodiment, if radiation is reflected from devices of the invention, then upon application of an electric field, the direction or axis of reflected radiation changes. In one embodiment, such change may be utilized in opto-electronic devices or in sensors wherein sensing of the change in electric field may be translated to change in radiation received at a local point in space.

In one embodiment the device of this invention comprises a ceria-based material of providing comparable electromechanical effect with high-end commercial electromechanically active materials (Examples 1 and 7). With higher operational fields, better elastic properties, absence of depoling and simple manufacturing.

Methods of the Invention

In one embodiment, this invention provides a process for making an electromechanical device, the process comprising:
  forming a first conductive layer;
  forming a layer of an active material in contact with said first conductive layer; and
  forming a second conductive layer in contact with said active material layer;
  wherein upon application of an electric field the active material generates displacement, stress or a combination thereof.

In one embodiment, this invention provides a process for making an electromechanical device, the process comprising:
  forming a first conductive layer;
  forming a layer of a ceria-based material in contact with said first conductive layer; and
  forming a second conductive layer in contact with said active material layer;
  wherein upon application of an electric field the active material generates displacement, stress or a combination thereof.

In one embodiment, the first conductive layer is formed on a substrate. In another embodiment, if the substrate is a conductive substrate, the first step of "forming s first conductive layer" absent and the active material layer is deposited directly on the conductive substrate. In one embodiment, the conductive layer is formed by electron beam deposition. In one embodiment, the layer of an active material is formed by radio frequency magnetron sputtering. In one embodiment, the first and the second conductive layers are connected to a power supply.

In one embodiment, the in-plane strain of the active material ranges between 0.1%-0.4%. In one embodiment, the active material comprising metal oxide. In one embodiment, the metal oxide is doped by a metal ion. In one embodiment, the metal ion is Gd. In one embodiment, the active material comprising $Ce_xGd_yO_z$. In one embodiment, the $Ce_xGd_yO_z$ comprising $Ce_{0.8}Gd_{0.2}O_{1.9}$. In one embodiment, x ranges between 0.95-0.63, y ranges between 0.05-0.37 and z ranges between 2-(y/2).

In one embodiment the displacement is at least 100 pm/V. In one embodiment, stress developed in said active material is at least 100 MPa.

In one embodiment, the active material comprising $ZrO_2$, $CeO_2$, $Bi_2O_3$, oxides of Sr, La, Fe, Co, or combinations thereof. In one embodiment, the active material further comprises any metal ion as a dopant. In one embodiment, the metal ion comprising a Lanthanide ion. In one embodiment, the conductive layer comprising metal. In one embodiment, the metal comprising Cr, Al, Ag, Ti. In one embodiment, the thickness of the conductive layer ranges between 50 nm and 150 nm.

In one embodiment, device is supported by a substrate. In one embodiment, the thickness of the substrate ranges between 50 micrometers and 500 micrometers. In one embodiment, the substrate comprising glass. In one embodiment, the active material is formed by radio frequency magnetron sputtering. In one embodiment, the thickness of the active material ranges between 0.35 and 1.0 micrometers.

In one embodiment, the electromechanical device functions as a sensor. In one embodiment, the electromechanical device functions as an actuator.

In one embodiment, devices can be prepared by any other technique suitable for deposition of $Ce_{0.8}Gd_{0.2}O_{1.9}$, or for any other active material of this invention e.g. PVD-physical vapor deposition, cathodic arc deposition, electron beam physical vapor deposition, pulsed laser deposition, atomic laser deposition; CVD—chemical vapor deposition: reactive sputtering, microwave plasma-assisted CVD, plasma-enhanced CVD, atomic layer CVD, combustion chemical vapor deposition, metal-organic chemical vapor deposition, hybrid physical-chemical vapor deposition, rapid thermal CVD, vapor phase epitaxy, powder metallurgy techniques, chemical solution deposition and any other technique as described in the art.

Uses of Devices of the Invention

In one embodiment, electromechanical devices of the invention are used as sensors of electric fields. In one embodiment, electromechanical devices of the invention are used to calibrate, operate, start, generate energy, to sense, to activate, to actuate, to generate movement in, to stop movement of, to push, pull, reflect radiation and/or to measure any device, system, apparatus or portions thereof as would be appreciated by a person skilled in the arts.

The following examples are presented in order to more fully illustrate the preferred embodiments of the invention. They should in no way be construed, however, as limiting the broad scope of the invention.

EXAMPLES

Example 1

Figure 1:
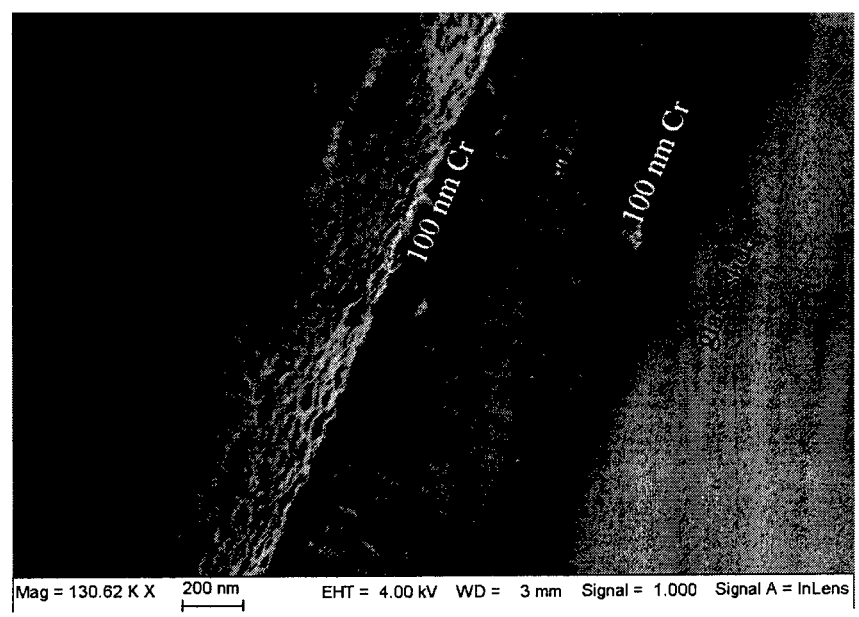
FIG. 1 is a scanning electron microscopy image of a cross section of the test structure: glass\metal\$Ce_{0.8}Gd_{0.2}O_{1.9}$\metal.

Experimental Verification of the Electromechanical Effects in $Ce_{0.8}Gd_{0.2}O_{1.9}$ Experimental Setup To demonstrate the electro-mechanical response in $Ce_{0.8}Gd_{0.2}O_{1.9}$, the following structures were prepared: (150 µm thick glass) as a substrate\(100 nm thick bottom contact as an electrode)\(500-1000 nm thick $Ce_{0.8}Gd_{0.2}O_{1.9}$) as dielectric medium\(100 nm thick top contact) as an electrode (FIG. 1). The $Ce_{0.8}Gd_{0.2}O_{1.9}$ was prepared by radio frequency magnetron sputtering: target $Ce_{0.8}Gd_{0.2}O_{1.9}$, power 100 W, pressure in the chamber 30 millitorr, gases Ar, $O_2$ in ratio of 1:1.

The top and the bottom contacts were prepared by electron beam evaporation. The contacts may be of the same metal or of different metals as long as they are chemically stable. Experiments were conducted with Al, Cr, Mo, Ag, Au and Ti. The structures, with lateral dimensions of 8×40 mm, were mounted on a brass stand with one end forming a cantilever (FIG. 2). A voltage of ±(1-4) V was applied between the top and the bottom contacts. Development of stress in the $Ce_{0.8}Gd_{0.2}O_{1.9}$ layer caused bending of the cantilever, which was detected by a home-built curvature measurement setup. A laser beam was sent perpendicular to the sample and the reflected beam was directed to a CCD camera. Two modes of measurements were utilized: a) the voltage was applied to the sample, inducing bending of the sample which caused displacement of the reflected beam, the position of which was monitored as a function of time; b) the curvature of the sample was measured by translating the sample and measuring the displacement of the reflected beam (FIG. 3). The change in stress in the films was calculated using the Stoney formula $$\sigma_t = \frac{E_s h_s^2}{6 h_f (1-v)} \Delta \kappa,$$

where $E_s$—is Young's modulus of the substrate, $v$—is the Poisson ratio of the substrate, $h_s$—is the thickness of the substrate, $h_f$—is the thickness of the $Ce_{0.8}Gd_{0.2}O_{1.9}$ film. $\Delta k$ is the change in curvature; (k is the curvature).

Field-Induced Stress in Glass\Metal\$Ce_{0.8}Gd_{0.2}O_{1.9}$\Metal Structures.

It was found that application of the external voltage results in the development of compressive stress in the structures. There are four features to emphasize:

1. Application of positive and negative bias caused compressive stress (FIG. 4), i.e., the electromechanical effect is invariant with respect to the direction of the electric field, similar to that of electrostriction. However, electrostriction may be significant only in materials with high dielectric constant. The dielectric constant of $Ce_{0.8}Gd_{0.2}O_{1.9}$ is below 28, which makes the electrostrictive effect, if any, very small.
2. It was found that the characteristic response time of the structures decreases from about 2 hours to less than 10 minutes as a result of [voltage application]-[voltage off] cycles (FIG. 5).
3. The magnitude of the electromechanical effect observed in $Ce_{0.8}Gd_{0.2}O_{1.9}$ is comparable or larger than that for many commercial electromechanically active materials (Table 1 and 2).

Table 1 demonstrates typical magnitude of the electromechanical response generated in glass\metal\$Ce_{0.8}Gd_{0.2}O_{1.9}$\metal structures. "CGO" denotes $Ce_{0.8}Gd_{0.2}O_{1.9}$ in one embodiment. $\Delta\sigma_{max}$ was calculated by the Stoney formula; the "pseudo" piezoelectric constants ($d_{31}$) of $Ce_{0.8}Gd_{0.2}O_{1.9}$, was calculated by $\Delta\sigma_{max} = Y \cdot d_{31} \cdot E$, wherein $E = V/t_{CGO}$, $Y = (210$ GPa Young modulus) and $t_{CGO}$ is the thickness of $Ce_{0.8}Gd_{0.2}O_{1.9}$.

TABLE 1

| Sample | Structure | Potential [V] | Field [KV/cm] | $\Delta\sigma$max [Mpa] | pseudo d31 [pm/V] |
|---|---|---|---|---|---|
| R7-2 | Cr/CGO/Cr | 2.5 | 57 | 585 | 490 |
| R7-4 | Cr/CGO/Cr | 3 | 68 | 875 | 611 |
| R8-1 | Al/CGO/Cr | 4 | 77 | 528 | 327 |
| R8-2 | Al/CGO/Ti | 4 | 77 | 695 | 430 |
| R9-6 | Cr/CGO/Cr | 4 | 125 | 459 | 175 |
| R4-1 | Cr/CGO/Cr | 2 | 46.5 | 1063 | 1088 |

Table 2 presents examples of commercial materials with the best known electromechanical response. All materials are based on $(Pb,Mn)(Zr,Ti,Nb)O_3$ oxides; PMN-PT30 and PZT-5H1 are from Morgan Technical Ceramics ElectroCeramics and PMN15 is from TRS Technologies; (Stress data is not provided for commercial piezoelectrics and electrostrictors, because maximal stress will depend from the stability of the material. "Pseudo" piezoelectric constants calculated for a given electric field provides better information for description of the electromechanical response).

| d31 [pm/V] | Commercial name | Material |
|---|---|---|
| 950 | PMN-PT30 | Single-crystal "giant" piezoelectric |
| 250 | PZT-5H1 | Polycrystalline piezoelectric |
| 230 | PMN15 | Polycrystalline electrostrictor |

*All materials are based on $(Pb, Mn)(Zr, Ti, Nb)O_3$ oxides.

4. Measurement of the strain in the $Ce_{0.8}Gd_{0.2}O_{1.9}$ layers by the X-Ray diffraction-based $\ln(1/\sin(\theta))$ vs $\sin^2(\Psi)$ technique revealed that those samples that have their in-plane strain, $u_{xx}$, within the range 0.1-0.4% exhibit electromechanical response.

Analysis

The Nature of the Electromechanical Effect in $Ce_{0.8}Gd_{0.2}O_{1.9}$.

The observed effect is quite different from other known electromechanical responses. It cannot be piezoelectric because $Ce_{0.8}Gd_{0.2}O_{1.9}$ has a fluorite centrosymmetric structure, which is incompatible with the existence of piezoelectricity. The response cannot be electrostrictive because of the argument given herein above. The observed effect cannot be attributed to the movement of the oxygen vacancies, the so called chemical stress effect because such an effect requires movement of oxygen vacancies over a distance of 500 nm over the time period of 10 min (see FIG. 5 last step). This implies that the diffusion coefficient of oxygen in $Ce_{0.8}Gd_{0.2}O_{1.9}$ at room temperature is about $(500$ nm$)^2/(10$ min$) = 4 \times 10^{-12}$ cm$^2$/s, which is at least four orders of magnitude higher than the highest values reported in the literature. Furthermore, the chemical stress has to be opposite with respect to the polarity of the applied electric field. All known electromechanical effects, do not depend on the preexisting strain.

However, the observed effect demonstrates that the electric field rearranges $Ce_{Ce}$—$V_O$ dipoles and leads to changes of the "effective" elastic modulus.

Example 2

Voltage-Stress Effect in $Ce_{0.8}Gd_{0.2}O_{1.9}$ Using Constant (DC) Bias Versus Alternating (AC) Bias Methods The voltage-stress behavior was studied on a number of samples connected in the single-clamped uniform beam mode (as presented in FIG. 2 and described in Example 1) to the reflected laser-beam experiment setup. The single-clamped uniform beam causes change in the radius of curvature as a result of electromechanical response. This fact was exploited for monitoring the electromechanical response by measuring the reflection from the sample of the laser beam. The diode-pumped solid-state laser [by Crysta-Laser®, 532 nm, beam divergence of 0.5 mrad] was used for these experiments. Monitoring the development of electromechanical stress was done by recording the reflected laser beam with Apogee® Alta® U2000 monochrome CCD camera. The change of the reflected spot on CCD camera was translated directly into the change in stress inside the thin CGO film using geometrical parameters of the system and Stoney formula.

The alternating voltage was applied in a form of $V_{AC}\cdot\cos(2\pi ft)+V_{DC}$ and the electromechanical fluctuations of the sample were recorded on CCD camera, as a motion of the reflected laser beam position.

Results

A bias of f=10 mHz, $V_{AC}$=2.5V with $V_{DC}$=2.5V was applied on strain-free {127 nm Cr\\631 nm CGO\\50 nm Cr}, the electromechanical response had high amplitude with a frequency of 10 mHz. However, while the $V_{DC}$ was switched off, the response doubled its frequency and decreased the amplitude as presented in FIG. 6.

To emphasize the contribution of $V_{AC}$ and $V_{DC}$ components on the electromechanical response frequency, high $V_{AC}$ and low $V_{DC}$ (f=10 mHz; $V_{AC}$=3.5V; $V_{DC}$=0.4V) were applied on {113 nm Cr\\720 nm CGO\\10 nm Ti+80 nm Au} sample. As presented in FIG. 7, each $2^{nd}$ (second) electromechanical peak has a higher amplitude, which is a result of both $V_{AC}$ and $V_{DC}$, while the smaller electromechanical peaks, refer to $V_{AC}$ only.

Such electromechanical behavior fits the electrostriction formalism, where the electromechanical stress is proportional to square of the applied field:

$$\sigma \propto \{V_{AC}\cdot\cos(2\pi ft)+V_{DC}\}^2 = V_{DC}^2 + \frac{V_{AC}^2}{2} + 2V_{AC}\cdot V_{DC}\cdot\cos(2\pi ft) + \frac{V_{AC}^2}{2}\cos(2\cdot 2\pi ft) \quad \text{Eq. 1}$$

Based on Eq. 1, the electromechanical response has two harmonic components relative to the applied frequency f when the first is a function of both $V_{AC}$ and $V_{DC}$, and the second (doubled)—of the $V_{AC}$ only. This explains the voltage dependence of the electromechanical response frequency.

The electromechanical response measured by the CCD camera was translated to the electromechanical stress inside the CGO film. For a given measurement, the amplitude of the response $\Delta X$ (in pixels multiplied by the pixel size, 7.5 µm/pixel) was measured, which was proportional to the change in the curvature $\Delta k$ of the reflective sample, by eq. 2 (for small changes):

$$\Delta k = \frac{\Delta X}{2L\cdot l} \quad \text{Eq. 2}$$

where: L—the optical path of the reflected laser beam from the sample to the CCD camera. l—the place on the sample, where the laser beam reflects from, measured from the clamped side. The change in curvature is translated to the change in electromechanical stress by Stoney's formula:

$$\Delta\sigma = \frac{Y_s}{1-\upsilon_s}\frac{t_s^2}{6t_f}\Delta k \quad \text{Eq. 3}$$

where: $Y_s$ and $\upsilon_s$ are Young modulus (~69 GPa) and Poisson's ratio (0.2) of the substrate (glass), $t_s$ and $t_f$ are the thicknesses of the substrate and film (CGO) respectively.

Each value of $\Delta\sigma$ was calculated by averaging more than 20 values of $\Delta X$. The error bars were taken into account including uncertainty in all the experimental parameters.

FIGS. 8, 9 and 10 present the electromechanical stress amplitude as a function of one bias component, when the rest parameters are fixed. The results presented in FIGS. 8, 9 and 10 fit the Eq. 1. When $V_{DC}\neq 0$, the electromechanical stress grew linearly with $V_{DC}$ or $V_{AC}$ and the dominant frequency of the response was the same as of the applied bias. The deflection from linearity at high biases in FIGS. 8 and 9 can be explained by field saturation. When $V_{DC}$=0, the only response frequency was the second harmonics (doubled), the stress amplitudes were lower and the resultant stress was a perfect parabolic function of $V_{AC}$.

Accordingly, it can be concluded that CGO thin films exhibited electrostrictive type of electromechanical behavior.

Example 3

Direct Force-Gauge Experiment in $Ce_{0.8}Gd_{0.2}O_{1.9}$ (CGO)

Methods

The samples in the same single-clamped uniform beam mode as described in Example 1 and FIG. 2 were connected to force gauge [Mark-10® SJR025 force gauge with 1N load capacity and 0.5 mN resolution], in order to prove that the electromechanical response generates real mechanical force. Free side of the beam touched the metal bar, coming out of the gauge. The preload of 10 mN were applied to increase the sensitivity of the system. The results of input bias of 10 mHz, $V_{DC}$=$V_{AC}$=2.5V on electromechanical force are presented in FIG. 11.

Results

FIG. 11 demonstrates that the CGO thin film generates mechanical force up to 1.5 mN, following the applied bias.

Example 4

Electromechanical Stress in $Ce_{0.8}Gd_{0.2}O_{1.9}$ (CGO) as a Function of Temperature Methods The effect of temperature on the electromechanical stress of CGO was studied on a sample in the single-clamped uniform beam mode as presented in Example 1 and FIG. 2, which was inserted to a home-made mini-furnace equipped with Eurotherm® 2216L temperature controller, closed from the five sides, to allow free fluctuations, and with a hole for the laser beam from above. The results, were collected by the reflected laser-beam experiment setup on {113 nm Cr\\720 nm CGO\\10 nm Ti+80 nm Au} sample, are presented in FIGS. 12 and 13.

Results

The stress amplitude dropped with increase of temperature on both harmonics. The experimental activation energy associated with this drop was about 0.25 eV. This energy was much lower compared to the activation energy of oxygen/oxygen-vacancies (~0.6 eV) movement, and closed to the reported values for activation of conducting electrons.

Example 5

Poling Process in $Ce_{0.8}Gd_{0.2}O_{1.9}$ (CGO)

Methods

In-situ monitoring of poling process in CGO thin film was performed on fresh unstrained {127 nm Cr\\631 nm CGO\\150 nm Cr} sample, connected in the single-clamped uniform beam geometry to reflected laser-beam experiment setup in room temperature. The applied AC bias was f=10 mHz, $V_{AC}$=1.97V, $V_D$=3.04V, maintained constant electric field on the sample for the poling and oscillation for monitoring the developed stress. The results of in-situ monitoring of poling are presented in FIG. 14.

Results

The sample fluctuated according to the applied bias during poling. The stress amplitude increased linearly during ~18 hr of poling until saturation of ~20 MPa.

Example 6

Frequency Response in $Ce_{0.8}Gd_{0.2}O_{1.9}$ (CGO)

Methods

Monitoring the frequency response in $Ce_{0.8}Gd_{0.2}O_{1.9}$ (CGO) was performed by measuring the fluctuation of the reflected laser beam with photodiode detector, connected to a Signal Recovery® 7265 DSP lock-in amplifier, which was synchronized with the Keithley® 3390 function generator (FIG. 15A). Single-clamped uniform beam and double-clamped uniform beam (FIG. 15B), connection modes of the sample were used during this experiment.

Both single-clamped and double-clamped modes exhibited mechanical resonance frequencies $f_n$, given by Eq. 5:

$$f_n = \left(\frac{\beta_n}{L_s}\right) \cdot \frac{t_s}{\pi} \sqrt{\frac{Y_s}{48\rho}} \quad \text{Eq. 5}$$

where: $L_s$—length of the cantilever till the clamp or between the clamps; $\rho$—density of the substrate (glass—2.5 gr/cm³; Si—2.329 gr/cm³); $Y_s$ and $t_s$—Young modulus (~69 GPa—glass; Si-100—130 GPa) and the thicknesses of the substrate; $\beta n$ constant for n's vibration mode. $B_0$=1.875, $\beta_1$=4.694, $\beta_2$=7.85, $\beta_3$=10.996 and $\beta_4$=14.137 for single-clamped uniform beam. $\beta_0$=4.73, $\beta_1$=7.8532 and $\beta_2$=10.9956 for double-clamped beam.

Results

FIGS. 16 and 17 and table 3 presents the frequency behavior of {150 μm glass\\100 nm Cr\\450 nm CGO\\100 nm Cr} strain-free sample, connected in single-clamped mode, under $V_{AC}$=0.9V and $V_{DC}$=1.72V:

TABLE 3

Measured and calculated values of mechanical resonances (FIGS. 17 and 18).

| | $L_s$ = 19 mm | | $L_s$ = 29.5 mm | | $L_s$ = 35 mm | |
|---|---|---|---|---|---|---|
| | measured | calculated | measured | calculated | measured | calculated |
| $f_0$ [Hz] | 361.7 | 352.6 ± 10.8 | 143.8 | 146.3 ± 3.8 | 102.9 | 103.9 ± 2.6 |
| $f_1$ [kHz] | 2.27 | 2.21 ± 0.07 | — | — | — | — |
| $f_2$ [kHz] | 6.34 | 6.18 ± 0.19 | — | — | — | — |

Accordingly, the above sample presented a single-clamped uniform beam electromechanical resonator, which fluctuated according to applied bias frequency. The quality factor Q was calculated for $L_s$=19 mm, $f_1$=2.27 kHz by Eq. 6 to be $Q_{(2.27\ kHz)}$=660. Thus, the resonator demonstrated a highly efficient electromechanical transducer or, alternatively, CGO is a highly efficient electromechanical material in the given frequency and experimental setup.

$$Q_{(fn)} = \frac{f_n}{\Delta f_n} = \frac{f_n}{f_2 - f_1} \quad \text{when} \quad \text{Eq. 6}$$

$f_1, f_2$ values at $\frac{1}{\sqrt{2}}$ of full peak height

The Electromechanical response was high at lower frequencies and decreased at higher frequency, where the electromechanical material, CGO, ceased to follow the alternating field.

The double-clamped beam mode having $L_s$=7 mm was chosen for measuring the relaxation (FIG. 15B). The results for frequency behavior of the sample in double-clamped beam mode are shown in FIG. 18.

The sample provided two definite, separated relaxations when no mechanical resonance was applied: (i) in 0.1-1 Hz region and (ii) 10-1000 Hz region. The second region (10-1000 Hz region), which was wider and more repeatable, was fitted by Debye-type relaxation model, shown in Eq. 7:

$$I = I_0 + \frac{a}{\sqrt{(2\pi f \cdot \tau_D)^2 + 1}} \quad \text{Eq. 7}$$

where I—normalized linear deflection amplitude; $I_0$, a—fitting parameters with no physical meaning due to arbitrary units of I; $\tau_D$—characteristic relaxation time for this Debye-type relaxation model.

Accordingly, CGO relaxed according to Debye-type relaxation formalism, with a characteristic relaxation time of $\tau_D \approx 5.5$ msec.

Example 7

Electrostrictive Coefficients and Comparison with Commercial Electromechanical Materials The electromechanical performance of CGO was compared with piezoelectrics and electrostrictors using pseudo-piezoelectric coefficient. Pseudo-piezoelectric coefficient $d_{31}$ for electrostrictors was calculated using Eq. 8 and, unlike for piezoelectrics, it was a function of the applied electric field:

$$d_{31(E)}^{CGO} = \frac{\sigma}{Y_{CGO}} \frac{1}{E} = 45.3 \frac{\text{pm}}{\text{V}} \quad \text{Eq. 8}$$

where σ—is stress amplitude, $Y_{CGO}$—Young modulus of CGO (~200 GPa) and E—applied electric field. The reported pseudo-piezoelectric and piezoelectric coefficients for TRS™ PMN15 and Morgan™ PZT401 materials are $d_{31(E=6.5\ kV/cm)}^{PMN15}$=230 pm/V and $d_{31}^{PZT401}$=132 pm/V respectively. However Young modulus of CGO is higher (~200 GPa vs. 105 GPa-PMN15 & 85 GPa-PZT401).

The $d_{31}$ value was multiplied by the corresponding Young modulus:

$$\gamma_{31(E=80kV/cm)}^{CGO} = \frac{\sigma}{E} = 9\ \frac{C}{m^2},$$

$$\gamma_{31}^{PZT401} = d_{31} \cdot Y = 10.8\ \frac{C}{m^2}\ \text{and}$$

$$\gamma_{31(E=6.5kV/cm)}^{PMN15} = d_{31} \cdot Y = 24.5\ \frac{C}{m^2}.$$

Accordingly, the properties of the CGO of this invention were comparable with high-end commercial electromechanically active materials. Moreover, the electrostrictor PMN15 had its higher electromechanical properties at 6.5 kV/cm, and generated stress of about $\gamma_{31(E=6.5\ kV/cm)}^{PMN15} \cdot E$=16 MPa. Alternatively, CGO operated at higher fields and had higher mechanical properties, demonstrated, higher stress measurements of about 36 MPa at 40 kV/cm during the experiments.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An electromechanical device comprising a ceria (cerium oxide) based material wherein said ceria-based material is doped by a metal ion and represented by the following formula $Ce_xM_yO_{(2-\delta)}$ wherein M is a metal ion having a valency of less than four: wherein 0<x<1, 0≤y<1, and 0≤δ<1, and has a centrosymmetric structure and has oxygen vacancies, wherein said ceria-based material is electrostrictive such that upon application of an electric field said ceria-based material generates displacement, stress or a combination thereof.

2. The device of claim 1, wherein said metal ion is a lanthanide.

3. The device of claim 2, wherein said metal ion is Gd.

4. The device of claim 3, wherein said ceria-based material is $Ce_xGd_yO_z$ wherein said x ranges between 0.95 and 0.63, said y ranges between 0.05 and 0.37 and said z ranges between 2 and (y/2).

5. The device of claim 4, wherein said $Ce_xGd_yO_z$ is $Ce_{0.8}Gd_{0.2}O_{1.9}$.

6. The device of claim 1, wherein said electric field is constant (DC) electric field, alternating (AC) electric field or combination thereof.

7. The device of claim 1, wherein said ceria-based material is strain-free.

8. The device of claim 1, wherein the in-plane strain of said ceria-based material ranges between 0.1%-0.4%.

9. The device of claim 1, wherein said ceria-based material is poled.

10. The device of claim 1, wherein said device further comprises conductive contacts.

11. The device of claim 10, wherein said conductive contacts comprising Cr, Al, Ag, Ti, or combination thereof.

12. The device of claim 11, wherein the thickness of said conductive contacts ranges between 50 nm and 150 nm.

13. The device of claim 1, wherein said device is supported by a substrate.

14. The device of claim 1, wherein said substrate comprising glass.

15. The device of claim 14, wherein the thickness of said glass ranges between 50 micrometers and 500 micrometers.

16. The device of claim 1, wherein the thickness of said ceria based material ranges between 0.35 and 1.0 micrometers.

17. A sensor comprising the device of claim 1.

18. An actuator comprising the device of claim 1.

19. The device of claim 1, wherein said ceria-based material is a bulk material or a thin film.

* * * * *